(12) United States Patent
Kim et al.

(10) Patent No.: US 11,265,496 B2
(45) Date of Patent: Mar. 1, 2022

(54) IMAGE SENSOR INCLUDING PIXELS MIRROR SYMMETRIC WITH EACH OTHER

(71) Applicant: Samsung Electronics Co., Ltd., Suwon-si (KR)

(72) Inventors: Munhwan Kim, Seoul (KR); Jooyeong Gong, Yongin-si (KR); Youngsun Oh, Hwaseong-si (KR); Yujung Choi, Yongin-si (KR); Hana Choi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/019,954

(22) Filed: Sep. 14, 2020

(65) Prior Publication Data

US 2021/0136303 A1 May 6, 2021

(30) Foreign Application Priority Data

Nov. 4, 2019 (KR) .................. 10-2019-0139549

(51) Int. Cl.
| | |
|---|---|
| *H04N 5/374* | (2011.01) |
| *H04N 9/04* | (2006.01) |
| *H01L 27/146* | (2006.01) |
| *H04N 5/369* | (2011.01) |
| *H04N 5/378* | (2011.01) |

(52) U.S. Cl.
CPC ......... *H04N 5/374* (2013.01); *H04N 5/36961* (2018.08); *H04N 5/378* (2013.01); *H04N 9/0455* (2018.08)

(58) Field of Classification Search
CPC ........... H04N 5/35554; H04N 5/36961; H04N 5/374; H04N 5/37457; H04N 5/378; H04N 9/0455; H04N 9/04551; H01L 27/14609; H01L 27/14621; H01L 27/14627; H01L 27/14641; H01L 27/14643
See application file for complete search history.

(56) References Cited

U.S. PATENT DOCUMENTS

| | | | |
|---|---|---|---|
| 9,165,959 B2* | 10/2015 | Chen | ................. H01L 27/14641 |
| 9,807,294 B2 | 10/2017 | Liu et al. | |
| 10,015,428 B2 | 7/2018 | Lee et al. | |
| 10,397,500 B1 | 8/2019 | Xu et al. | |
| 2012/0175498 A1* | 7/2012 | Krymski | ........... H01L 27/14609 250/208.1 |
| 2014/0239152 A1 | 8/2014 | Chen et al. | |
| 2015/0350583 A1* | 12/2015 | Mauritzson | ............ H04N 5/374 250/208.1 |

(Continued)

FOREIGN PATENT DOCUMENTS

WO    WO-2019/026718 A1    2/2019

*Primary Examiner* — Lin Ye
*Assistant Examiner* — Chriss S Yoder, III
(74) *Attorney, Agent, or Firm* — Harness, Dickey & Pierce, P.L.C.

(57) ABSTRACT

An image sensor may include a plurality of first pixels arranged on a substrate along a first axis and a second axis, the plurality of first pixels connected to a first output line, a plurality of second pixels arranged on the substrate along the first axis and the second axis, the plurality of second pixels being mirror-symmetric to the plurality of first pixels along the first axis, and the plurality of second pixels connected to the first output line, a plurality of first color filters, and a plurality of second color filters.

20 Claims, 21 Drawing Sheets

(56) References Cited

U.S. PATENT DOCUMENTS

| | | |
|---|---|---|
| 2018/0182804 A1 | 6/2018 | Lee et al. |
| 2018/0242827 A1 | 8/2018 | Michihata |
| 2018/0343404 A1 | 11/2018 | Hwang et al. |
| 2018/0352199 A1 | 12/2018 | Hwang et al. |
| 2019/0103428 A1 | 4/2019 | Wei et al. |
| 2019/0386057 A1* | 12/2019 | Wang ................ H01L 27/14643 |
| 2020/0059618 A1* | 2/2020 | Watanabe ......... H01L 27/14627 |
| 2020/0162691 A1* | 5/2020 | Mori ..................... H04N 5/378 |

\* cited by examiner

IMAGE SENSOR INCLUDING PIXELS MIRROR SYMMETRIC WITH EACH OTHER

CROSS-REFERENCE TO RELATED APPLICATIONS

This U.S. non-provisional application claims the benefit of priority under 35 U.S.C. § 119 to Korean Patent Application No. 10-2019-0139549, filed on Nov. 4, 2019, in the Korean Intellectual Property Office, the entire disclosure of which is incorporated by reference herein in its entirety.

BACKGROUND

Various example embodiments of the inventive concepts described herein relate to an image sensor, system including an image sensor, and/or method of operating an image sensor, and more particularly, relate to an image sensor including pixels mirror-symmetric with each other.

As the computer industry and the communication industry has developed, there has been an increasing demand for a high-performance image sensor in various electronic devices such as a digital camera, a camcorder, a personal communication system (PCS), a game console, a security camera, and/or a medical micro camera, etc. An image sensor may convert an optical image to an electrical signal. A pixel of the image sensor includes a photoelectric conversion element that senses a light incident from the outside, and converts the sensed light into an electrical signal. As the number of pixels in the image sensor gradually increases, there is a larger number of pixels which share a floating diffusion area storing electrons integrated by photoelectric conversion elements.

SUMMARY

Various example embodiments of the inventive concepts provide an image sensor including pixels mirror-symmetric with each other, a system including the image sensor, and/or methods of operating the image sensor.

According to at least one example embodiment, an image sensor includes a plurality of first pixels arranged in a M×N grid on a substrate along a first axis and a second axis, M and N being integers of 1 or more, the plurality of first pixels connected to at least one output line extending along the second axis; a plurality of second pixels arranged in the M×N grid on the substrate along the first axis and the second axis, the plurality of second pixels being mirror-symmetric to the plurality of first pixels with respect to the first axis, and the plurality of second pixels connected to the at least one output line; a plurality of first color filters arranged in the M×N grid on the plurality of first pixels, each of the plurality of first color filters having a first color; and a plurality of second color filters arranged in the M×N grid on the plurality of second pixels, each of the plurality of second color filters having a second color.

According to at least one example embodiment, an image sensor includes a plurality of unit pixel groups repeatedly arranged along a first axis and a second axis. Each of the plurality of unit pixel groups includes a plurality of first shared pixels arranged in a 1×N grid, N being an integer of 2 or more, along the second axis, and connected with a first output line extending along the second axis; and a plurality of second shared pixels arranged in a 1×N grid along the second axis, and connected with the first output line. The plurality of second shared pixels are mirror-symmetric to the plurality of first shared pixels with respect to the first axis.

According to at least one example embodiment, an image sensor may include a plurality of first pixels arranged in a M×N grid located on a substrate along a first axis and a second axis, the plurality of first pixels including M first shared pixel groups each including N first pixels, each of M first shared pixel groups configured to share a first floating diffusion area, each of the M first shared pixel groups connected with a first output line extending along the second axis, and M being an integer of 2 or more, and N being an integer of 2 or more; and a plurality of second pixels arranged in a M×N grid located on the substrate along the first axis and the second axis, the plurality of second pixels including M second shared pixel groups each including N second pixels, each of the M second shared pixel groups configured to share a second floating diffusion area, and each of the M first shared pixel groups connected with a first output line. Each of the first shared pixel groups is mirror-symmetric to a corresponding shared pixel group of the second shared pixel groups with respect to the first axis.

BRIEF DESCRIPTION OF THE FIGURES

The above and other objects and features of the example embodiments of the inventive concepts will become apparent by describing in detail example embodiments thereof with reference to the accompanying drawings.

DETAILED DESCRIPTION

Figure 1:
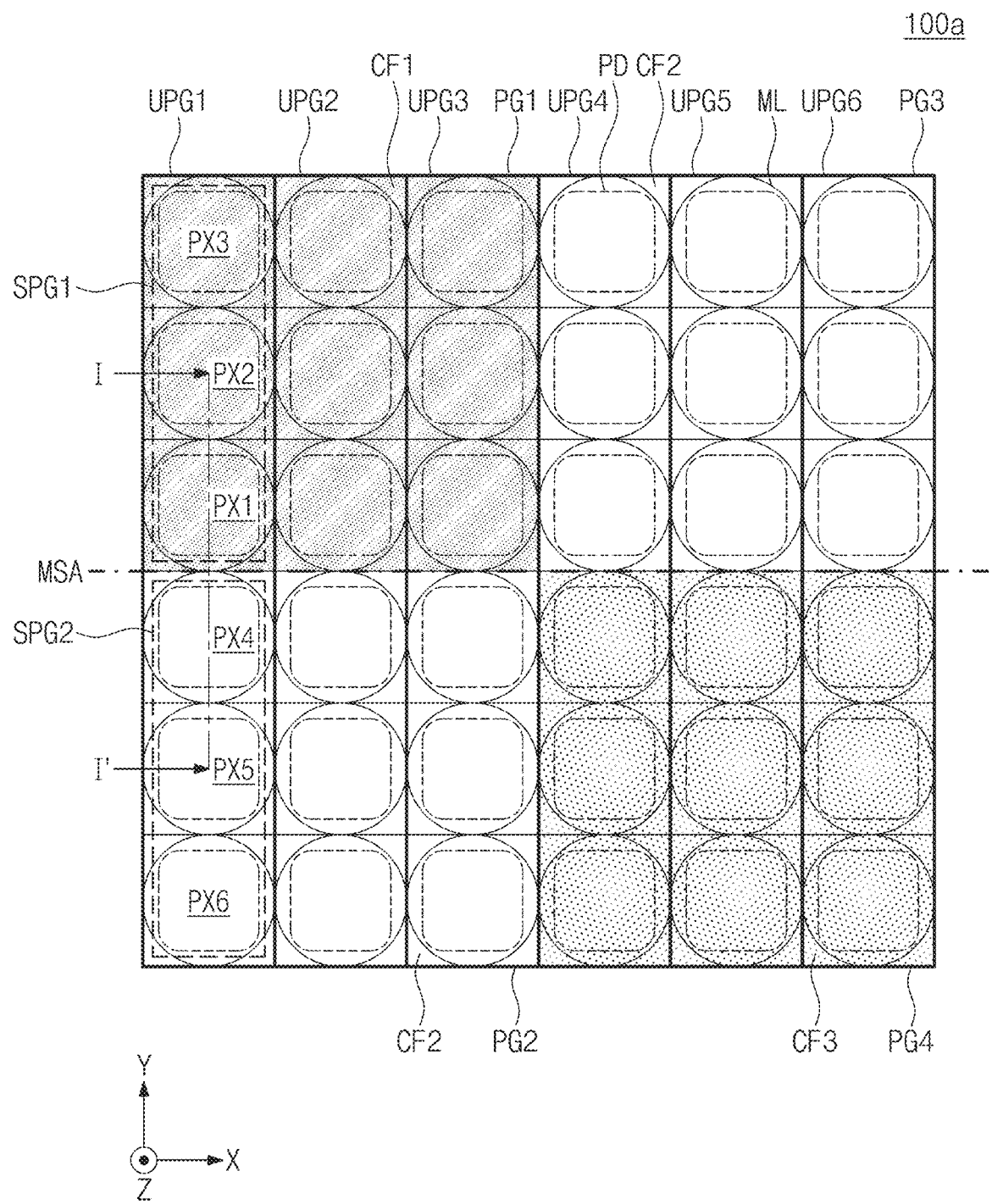
FIG. 1 illustrates a plan view of an image sensor according to at least one example embodiment of the inventive concepts.

Below, various example embodiments of the inventive concepts may be described in detail and clearly to such an extent that an ordinary one in the art may implement the inventive concepts. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity Like reference characters and/or numerals in the drawings denote like elements, and thus their description may be omitted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 illustrates a plan view of an image sensor according to at least one example embodiment of the inventive concepts. An image sensor 100a may include a plurality of unit pixel groups, such as unit pixel groups UPG1 to UPG6, etc. Each unit pixel group may include a plurality of pixels. A unit pixel group UPG (e.g., one of UPG1 to UPG6, etc.) may be located on a substrate 1 (refer to FIG. 2) of the image sensor 100a repeatedly along, for reference, an X-axis, but is not limited thereto. For example, in the case where the unit pixel group UPG1 moves in parallel along the X-axis, the unit pixel group UPG1 may overlap any one of the remaining unit pixel groups UPG2 to UPG6 in a plan view (when the image sensor 100a is viewed from above a plane perpendicular to a Z-axis), but is not limited thereto. Although not illustrated in FIG. 1, the unit pixel group UPG may be arranged on the substrate 1 of the image sensor 100a repeatedly along a Y-axis, etc. Also, in the case where the unit pixel group UPG1 moves in parallel along the Y-axis, the unit pixel group UPG1 may overlap any other unit pixel group (not illustrated) in a plan view. Referring to FIG. 1, 6 unit pixel groups UPG are arranged at the image sensor 100a along the X-axis, but the number of unit pixel groups UPG described above is only an example and the number of unit pixel groups may vary, and the arrangement of the unit pixel groups may vary.

The unit pixel group UPG1 may include "1×N" pixels, e.g., PX1 to PX6, arranged along the Y-axis. Here, "1" represents the number of pixels arranged along the X-axis, "N" represents the number of pixels arranged along the Y-axis, and "N" is an integer of 1 or more (in the case of FIG. 1, N=6), but the example embodiments are not limited thereto. In at least one example embodiment, "1×3" pixels PX1 to PX3 (e.g., a shared pixel group SPG1) of the unit pixel group UPG1 and "1×3" pixels PX4 to PX6 (e.g., a shared pixel group SPG2) of the unit pixel group UPG1 may be mirror-symmetric with respect to the X-axis. The term "mirror-symmetric" refers to a case wherein any axis that separates the pixel PX1 from the pixel PX4 and is parallel to the X-axis is a mirror-symmetric axis MSA of the, for example, "1×3" pixels PX1 to PX3 and the "1×3" pixels PX4 to PX6, but is not limited thereto. In other words, the arrangement of the pixels of a first shared pixel group may be symmetrical to the pixels of a second shared pixel group across an axis, such as the MSA-axis of FIG. 1, but the example embodiments are not limited thereto. As shown in FIG. 1, the "1×3" pixels PX1 to PX3 of the unit pixel group UPG1 and the "1×3" pixels PX4 to PX6 of the unit pixel group UPG1 may be mirror-symmetric with respect to a plane MSA at which the shared pixel group SPG1 and the shared pixel group SPG2 contact, and which separates the shared pixel group SPG1 from the shared pixel group SPG2. Here, the plane MSA may be a plane defined by the Z-axis and the mirror-symmetric axis MSA parallel to the X-axis, but is not limited thereto. A criterion of mirror symmetry to be described below may be one of the X-axis, the mirror-symmetric axis MSA, and the plane MSA, etc.

The plurality of pixels, e.g., PX1 to PX3, of the plurality of unit pixel groups, e.g., UPG1 to UPG3, may constitute a pixel group PG1, and color filter(s) CF1 may be located on top of and/or included in the pixel group PG1. The remaining pixels, e.g., PX4 to PX6, of the unit pixel groups UPG1 to UPG3 may constitute a second pixel group PG2, and one or more color filters CF2 may be on the pixel group PG2, etc. The pixels PX1 to PX3 of the unit pixel groups UPG4 to UPG6 may constitute a pixel group PG3, and the one or more color filters CF2 may be on the pixel group PG3, etc. The remaining pixels PX4 to PX6 of the unit pixel groups UPG4 to UPG6 may constitute a pixel group PG4, and one or more color filters CF3 may be on the pixel group PG4, etc. Each of the color filters CF1 to CF3 may selectively transmit one of colors of a light incident onto the image sensor 100a. For example, the color filters CF1 may sense a blue, the color filters CF2 may sense a green, and the color filters CF3 may sense a red, etc., but the example embodiments are not limited thereto. For example, the color filters CF1 to CF3 may constitute an RGB Bayer color filter array. For another example, each of the color filters CF1 to CF3 may sense one of other colors such as yellow, cyan, magenta, and white. Each of the color filters, e.g., CF1 to CF3, etc., may constitute a single color filter covering a plurality of pixels of the corresponding pixel group (e.g., PG1 to PG4, etc.), or may be several individual color filters covering one or more pixels (e.g., a subset of pixels) of the corresponding pixel group.

A pixel group PG (e.g., one of PG1 to PG4) may include "M×N" pixels. Here, "M" may represent the number of pixels arranged along the X-axis, and each of "M" and "N" may be an integer of 1 or more. "M" and "N" are equal, and an example is illustrated in FIG. 1 as each of "M" and "N" is "3" (i.e., one pixel group PG including "3×3" pixels), etc. However, the number of pixels included in one pixel group PG is not limited to the example illustrated in FIG. 1 and may be greater or lesser than the number of pixels shown in FIG. 1. A pixel PX (e.g., one of PX1 to PX6) may include a photoelectric conversion element PD, and a micro lens part IML may be further located on a color filter CF (e.g., one of CF1 to CF3) that is on the pixel PX, but the example embodiments are not limited thereto.

Figure 2:
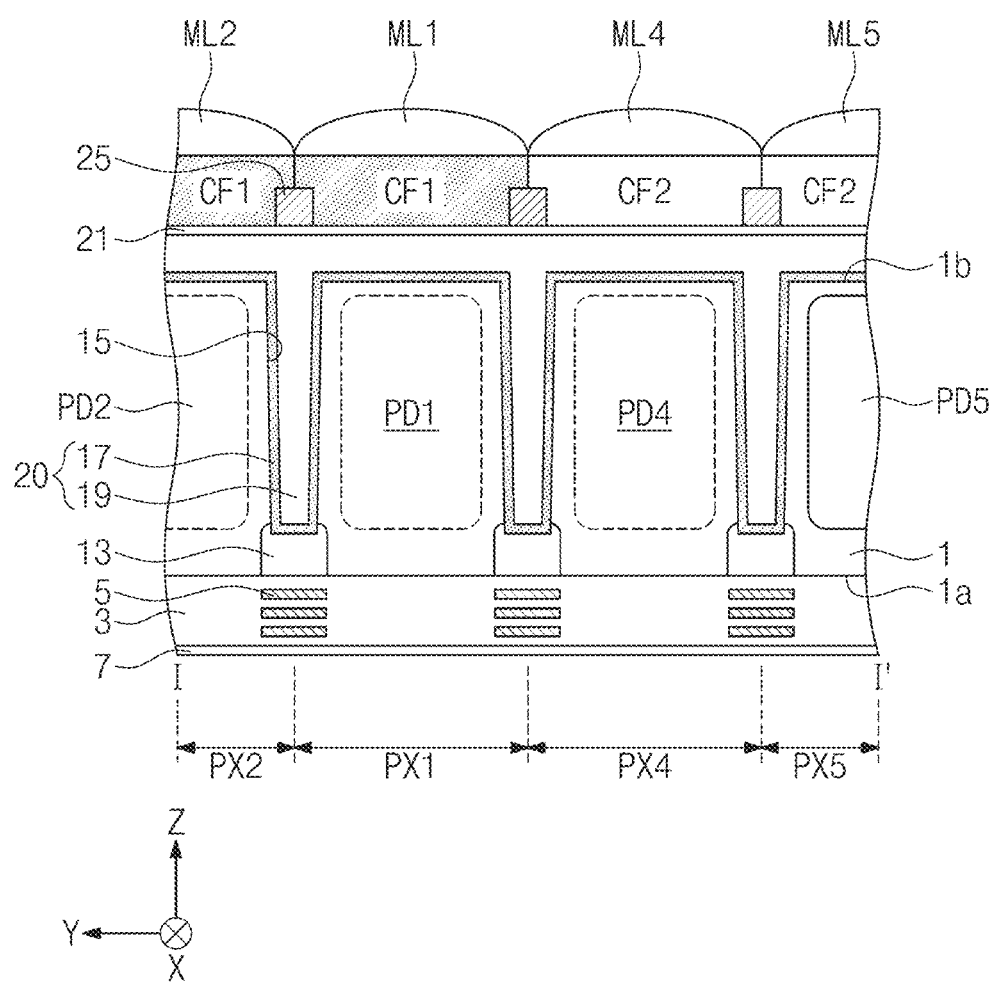
FIG. 2 is a cross-sectional view of an image sensor taken along line I-I' of FIG. 1 according to at least one example embodiment.

FIG. 2 is a cross-sectional view of an image sensor taken along line I-I' of FIG. 1 according to at least one example embodiment. The image sensor 100a may include the substrate 1, and the substrate 1 may include a surface 1a and a surface 1b facing away from each other. A light may be incident onto the surface 1b. The substrate 1 may be a semiconductor single crystalline substrate or a semiconductor epitaxial layer, but the example embodiments are not limited thereto. The substrate 1 may be doped with a first-type impurity. For example, the substrate 1 may be doped with a P-type impurity, or may be an N-type impurity according to other example embodiments. The pixels PX1, PX2, PX4, and PX5 may be separated from each other by a deep device isolation layer 20, but is not limited thereto. For example, the size of each of the pixels PX1, PX2, PX4, and PX5 may be approximately 0.8 µm or less, may be approximately 0.6 µm to approximately 0.7 µm, or may be approximately 0.5 µm to approximately 0.6 µm, but is not limited thereto. The deep device isolation layer 20 may be in a deep trench 15 formed at the substrate 1, but the example embodiments are not limited thereto. The deep trench 15 may be formed toward the surface 1a from the surface 1b of the substrate 1, etc. The deep device isolation layer 20 may include a fixed charge layer 17 and/or a buried insulating layer 19, etc. The fixed charge layer 17 may conformally cover an inner side wall of the deep trench 15, but is not limited thereto. The fixed charge layer 17 may be extended out of the deep trench 15, and may cover the surface 1b of the substrate 1. The buried insulating layer 19 may fill the deep trench 15. The buried insulating layer 19 may be extended out of the deep trench 15 and may cover the surface 1b of the substrate 1. The fixed charge layer 17 may be formed of metal oxide and/or metal fluoride including an insufficient amount of oxygen or fluoride compared to the stoichiometry. As such, the fixed charge layer 17 may have a negative fixed charge, but is not limited thereto. The fixed charge layer 17 may be formed of metal oxide and/or metal fluoride including at least one of hafnium (Hf), zirconium (Zr), aluminum (Al), tantalum (Ta), titanium (Ti), yttrium (y), and/or lanthanoid, etc., but is not limited thereto. Hole accumulation may occur around the fixed charge layer 17. As such, the occurrence of a dark current and/or a white spot may effectively decrease. The fixed charge layer 17 may be at least one of an aluminum oxide layer and/or a hafnium oxide layer, etc., but is not limited thereto. The fixed charge layer 17 may be in contact with the substrate 1. The buried insulating layer 19 may be formed from a material of a silicon oxide group having a good buried characteristic. Although not described in drawings, one or more transistors (refer to T1 to T6, R1, R2, SF1, SF2, SE1, and SE2 of FIG. 3) may be formed on the surface 1a of the substrate 1. The surface 1a of the substrate 1 may be covered with an interlayer insulating layer 3. The interlayer insulating layer 3 may have a multi-layered insulating layer structure, but is not limited thereto. Multi-layered wires 5 may be in and/or on the interlayer insulating layer 3. The interlayer insulating layer 3 may be covered with a passivation layer 7, but is not limited thereto. The passivation layer 7 may include a silicon nitride layer, etc. A device isolation area 13 may be arranged on the substrate 1 so as to be adjacent to the surface 1a. The device isolation area 13 may be doped with an impurity of the same type as the impurity doped in the substrate 1, but the concentration of the impurity doped in the device isolation area 13 may be higher than the concentration of the impurity doped in the substrate 1, but the example embodiments are not limited thereto. For example, the device isolation area 13 may be doped with a P-type impurity, or may be an N-type impurity according to other example embodiments. The deep device isolation layer 20 may be in contact with the device isolation area 13. A plurality of photoelectric conversion elements, e.g., PD1, PD2, PD4, and PD5, etc., of a plurality of pixels, e.g., PX1, PX2, PX4, and PX5, etc., may be on the substrate 1. For example, the photoelectric conversion elements PD1, PD2, PD4, and PD5 may have the same area, or may have varying areas. The plurality of photoelectric conversion elements, e.g., PD1, PD2, PD4, and PD5, etc., may be doped with an impurity different from the impurity doped in the substrate 1 in a conductive type. For example, the photoelectric conversion elements PD1, PD2, PD4, and PD5 may be doped with an N-type impurity, if the substrate 1 is doped with a P-type impurity, etc. An auxiliary insulating layer 21 may be on the buried insulating layer 19 that is on the surface 1b of the substrate 1. The auxiliary insulating layer 21 may be an adhesive layer, an anti-reflection layer, and/or a planarization layer, etc. The auxiliary insulating layer 21 may include at least one of an aluminum oxide layer, a silicon nitride layer, and/or an organic insulating layer, etc., but the example embodiments are not limited thereto. Light shielding patterns 25 may be on the auxiliary insulating layer 21. The light shielding patterns 25 may include metal, such as tungsten, titanium, etc. The light shielding patterns 25 may decrease and/or prevent cross-talk between adjacent pixels. In a plan view, the light shielding patterns 25 may have a grid shape, but the example embodiments are not limited thereto. One or more color filters, such as color filters CF1 and CF2 (CF3 being also possible), etc., may be between the light shielding patterns 25 on the auxiliary insulating layer 21 in an array shape. For example, the color filters CF1 respectively corresponding to the pixels PX1 and PX2 may be on the auxiliary insulating layer 21. Additionally, the color filters CF2 respectively corresponding to the pixels PX4 and PX5 may be on the auxiliary insulating layer 21. A micro lens array layer may be on the one or more color filters, e.g., color filters CF1 and CF2, etc. The micro lens array layer may include a plurality of micro lens parts, such as micro lens parts ML1 and ML2 respectively on the pixels PX1 and PX2, and micro lens parts ML4 and ML5 respectively on the pixels PX4 and PX5, etc. Each of the micro lens parts ML1, ML2, ML4, and ML5 may be formed in the shape of a circle in a plan view and may have a hemispheric cross section, but the example embodiments are not limited thereto, and the micro lens parts may have other shapes.

Figure 3:
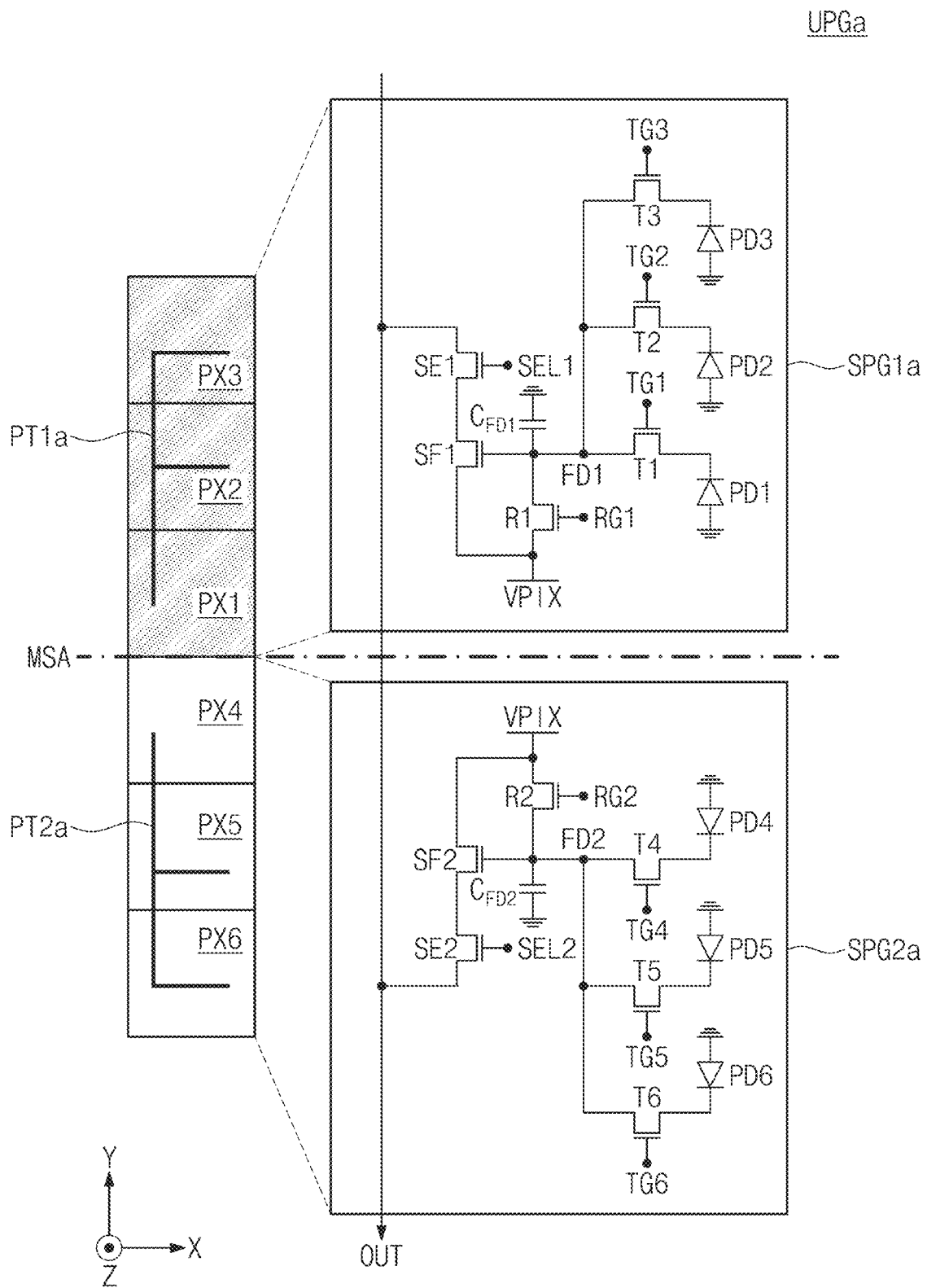
FIG. 3 illustrates a circuit diagram and a layout of a unit pixel group of FIG. 1, according to at least one example embodiment of the inventive concepts.

FIG. 3 illustrates a circuit diagram and a layout of a unit pixel group of FIG. 1, according to at least one example embodiment of the inventive concepts. A unit pixel group UPGa may be an example of the unit pixel group UPG of FIG. 1. According to at least one example embodiment, the unit pixel group UPGa may include a "1×3" arrangement of pixels PX1 to PX3, and may further include photoelectric conversion elements PD1 to PD3, a plurality of transfer transistors, e.g., transfer transistors T1 to T3, a floating diffusion area FD1 (or a floating diffusion node), a reset transistor R1, a source follower transistor SF1, and/or a selection transistor SE1, but the example embodiments are not limited thereto, and may have a greater or lesser number of constituent elements.

Each of the plurality of photoelectric conversion elements, e.g., PD1 to PD3, may generate and accumulate electrons (e.g., charges) corresponding to a light incident onto the image sensor 100a. For example, a photo diode, a photo transistor, a photo gate, a pinned photo diode, or any combination thereof, may be used as the photoelectric conversion elements, e.g., PD1 to PD3, etc. Below, the description will be given as each of the photoelectric conversion elements PD1 to PD3 is a photo diode, but the example embodiments are not limited thereto.

First ends of the plurality of transfer transistors, e.g., T1 to T3, etc., may be respectively connected with the plurality of photoelectric conversion elements, e.g., PD1 to PD3, and second ends of the transfer transistors T1 to T3 may be connected in common with the floating diffusion area FD1, however the example embodiments are not limited thereto. The plurality of transfer transistors T1 to T3 may transfer electrons integrated (e.g., collected, etc.) by the plurality of photoelectric conversion elements PD1 to PD3 to the floating diffusion area FD1 based on a plurality of transfer gate signals, e.g., TG1 to TG3. The floating diffusion area FD1 may accumulate and store the electrons provided from the plurality of transfer transistors T1 to T3. A capacitance (e.g., capacitance level, capacitance value, etc.) of the floating diffusion area FD1 may be "$C_{FD1}$". A voltage level of the floating diffusion area FD1 may be decided and/or depend on the capacitance $C_{FD1}$ and the amount of electrons provided from the transfer transistors T1 to T3. The reset transistor R1 may reset the floating diffusion area FD1. For example, the reset transistor R1 may electrically connect the floating diffusion area FD1 and a power supply voltage VPIX based on a reset signal RG1, etc. The reset transistor R1 may drive a voltage level of the floating diffusion area FD1 with the power supply voltage VPIX based on the reset signal RG1, and may remove or discharge the electrons stored in the floating diffusion area FD1.

According to at least one example embodiment, the source follower transistor SF1 may be connected between the power supply voltage VPIX and the selection transistor SE1. A gate terminal of the source follower transistor SF1 may be connected with the floating diffusion area FD1. The source follower transistor SF1 may output an output signal to the selection transistor SE1 based on a voltage level of the floating diffusion area FD1. The source follower transistor SF1 may be a source follower buffer amplifier, but is not limited thereto. The selection transistor SE1 may be connected between the source follower transistor SF1 and an output line. The selection transistor SE1 may transfer an output signal OUT through the output line based on a selection signal SEL1, but is not limited thereto. An example is illustrated as the transistors described above are NMOS transistors, but the transistors may be implemented with PMOS transistors or a combination of PMOS transistors and NMOS transistors, and/or may include a greater or lesser number of transistors, etc.

The "1×3" pixels PX1 to PX3 may include the "1×3" photoelectric conversion elements PD1 to PD3 and the "1×3" transfer transistors T1 to T3, but are not limited thereto. The "1×3" pixels PX1 to PX3 may share one floating diffusion area FD1. The "1×3" pixels PX1 to PX3 may be collectively referred to as a "shared pixel group SPG1a", and each of the "1×3" pixels PX1 to PX3 may be referred to as a "shared pixel". Referring to FIGS. 1 and 3 together, the pixel group PG1 including "M×M" pixels PX1 to PX3 of the unit pixel groups UPG1 and UPG3 may be divided into "M×1" shared pixel groups SPG1a, but the example embodiments are not limited thereto, and for example, may include a pixel group of "M×N" pixels, etc., and/or shared pixel groups of different arrangements, e.g., "M×2", etc.

As the "1×3" pixels PX1 to PX3 share one floating diffusion area FD1, one read circuit (e.g., R1, SE1, SF1) may be desired and/or required to reset the floating diffusion area FD1 and/or read a voltage level of the floating diffusion area FD1. The "1×3" pixels PX1 to PX3 are described as an example, and, for example, the shared pixel group SPG1a including "1×N" pixels may include "1×N" photoelectric conversion elements, "1×N" transfer transistors, and may further include one floating diffusion area FD1 and at least one read circuit, etc. "1×3" pixels PX4 to PX6 of the unit pixel group UPGa may include a plurality of photoelectric conversion elements PD4 to PD6, a plurality of transfer transistors T4 to T6, a floating diffusion area FD2, a reset transistor R2, a source follower transistor SF2, and/or a selection transistor SE2, etc. The "1×3" pixels PX1 to PX3 may receive the plurality of transfer gate signals TG1 to TG3, the reset signal RG1, and a select signal SEL1 Additionally, the "1×3" pixels PX4 to PX6 may receive a plurality of transfer gate signals TG4 to TG6, a reset signal RG2, and/or a select signal SEL2, etc. The "1×3" pixels PX1 to PX3 may output the output signal OUT based on a voltage level of the floating diffusion area FD1, and the "1×3" pixels PX4 to PX6 may output a different output signal OUT based on a voltage level of the floating diffusion area FD2. The output signal OUT of the "1×3" pixels PX1 to PX3 and the output signal OUT of the "1×3" pixels PX4 to PX6 may be output through the same output line (e.g., the same output wire, etc.), but is not limited thereto, and in other example embodiments, the output signal for the "1×3" pixels may be output through different output lines. The "1×3" pixels PX4 to PX6 may constitute a shared pixel group SPG2a sharing the floating diffusion area FD2 having a capacitance $C_{FD2}$. The components PD4 to PD6, T4 to T6, FD2, R2, SF2, and SE2 of the "1×3" pixels PX4 to PX6 may be implemented to be identical or substantially identical to the components PD1 to PD3, T1 to T3, FD1, R1, SF1, and SE1 of the "1×3" pixels PX1 to PX3, except that the signals TG1 to TG3, RG1, and SEL1 applied to the "1×3" pixels PX1 to PX3, and the signals TG4 to TG6, RG2, and SEL2 applied to the "1×3" pixels PX4 to PX6 are different, but the example embodiments are not limited thereto.

As described above, according to at least one example embodiment, the unit pixel group UPGa may include the shared pixel groups SPG1a and SPG2a. Each of the shared pixel groups SPG1a and SPG2a may include "1×N" pixels, but are not limited thereto, and the unit pixel group UPGa may include "1×2N" pixels, but is not limited thereto. As the unit pixel group UPGa is repeatedly arranged along the X-axis and the Y-axis, the unit pixel groups UPGa may constitute a pixel array (refer to, e.g., 1100 of FIG. 19) of the image sensor 100a. Color filters on the shared pixel group SPG1a, and color filters on the shared pixel group SPG2a may have different colors, but are not limited thereto. For example, the color filters on the shared pixel group SPG1a may have the same color, and the color filters on the shared pixel group SPG2a may have the same color, etc.

The shared pixel group SPG1a and the shared pixel group SPG2a of the unit pixel group UPGa may be mirror-symmetric with respect to one axis, such as the X-axis (refer to MSA). The shared pixel group SPG1a may include a layout pattern PT1a, and the shared pixel group SPG2a may include a layout pattern PT2a, but are not limited thereto. For example, the letter "F" illustrated in FIG. 3 (e.g., PT1a) and other drawings, and the letter "F" (e.g., PT2a) demonstrate the "mirror-symmetric" concept with regards to the illustrated layout patterns PT1a and PT2a, for the sake of explanation of the mirror-symmetric concept, and do not indicate the actual layout patterns of PT1a and PT2a.

The layout patterns PT1a and PT2a may be mirror-symmetric with respect to the X-axis (refer to MSA), but is not limited thereto. For example, the layout pattern PT1a may include an area in which the components PD1 to PD3, T1 to T3, FD1, R1, SF1, and SE1 are formed or implemented, terminals (e.g., a gate terminal, a source terminal, and a drain terminal) of the components PD1 to PD3, T1 to T3, FD1, R1, SF1, and SE1, metal wires (or lines) for electrically connecting the above terminals, a via for electrically connecting at least two of the terminals and the metal wires, or junctions, etc. The layout pattern PT2a may include an area in which the components PD4 to PD6, T4 to T6, FD2, R2, SF2, and SE2 are formed or implemented, terminals (e.g., a gate terminal, a source terminal, and a drain terminal) of the components PD4 to PD6, T4 to T6, FD2, R2, SF2, and SE2, metal wires (or lines) for electrically connecting the above terminals, a via for electrically connecting at least two of the terminals and the metal wires, or junctions, etc.

According to at least one example embodiment of the inventive concepts, the pixels PX1 to PX3 of a unit pixel group repeatedly arranged may be mirror-symmetric with the pixels PX4 to PX6 of the unit pixel group across one axis of a semiconductor. Accordingly, as a unit pixel group is repeatedly arranged, a pattern for implementing the pixels PX1 to PX6 in the unit pixel group may be regularly implemented, and a characteristic difference of the pixels PX1 to PX6 due to a difference between layouts of the pixels PX1 to PX6 may be reduced, removed and/or excluded.

Figure 4:
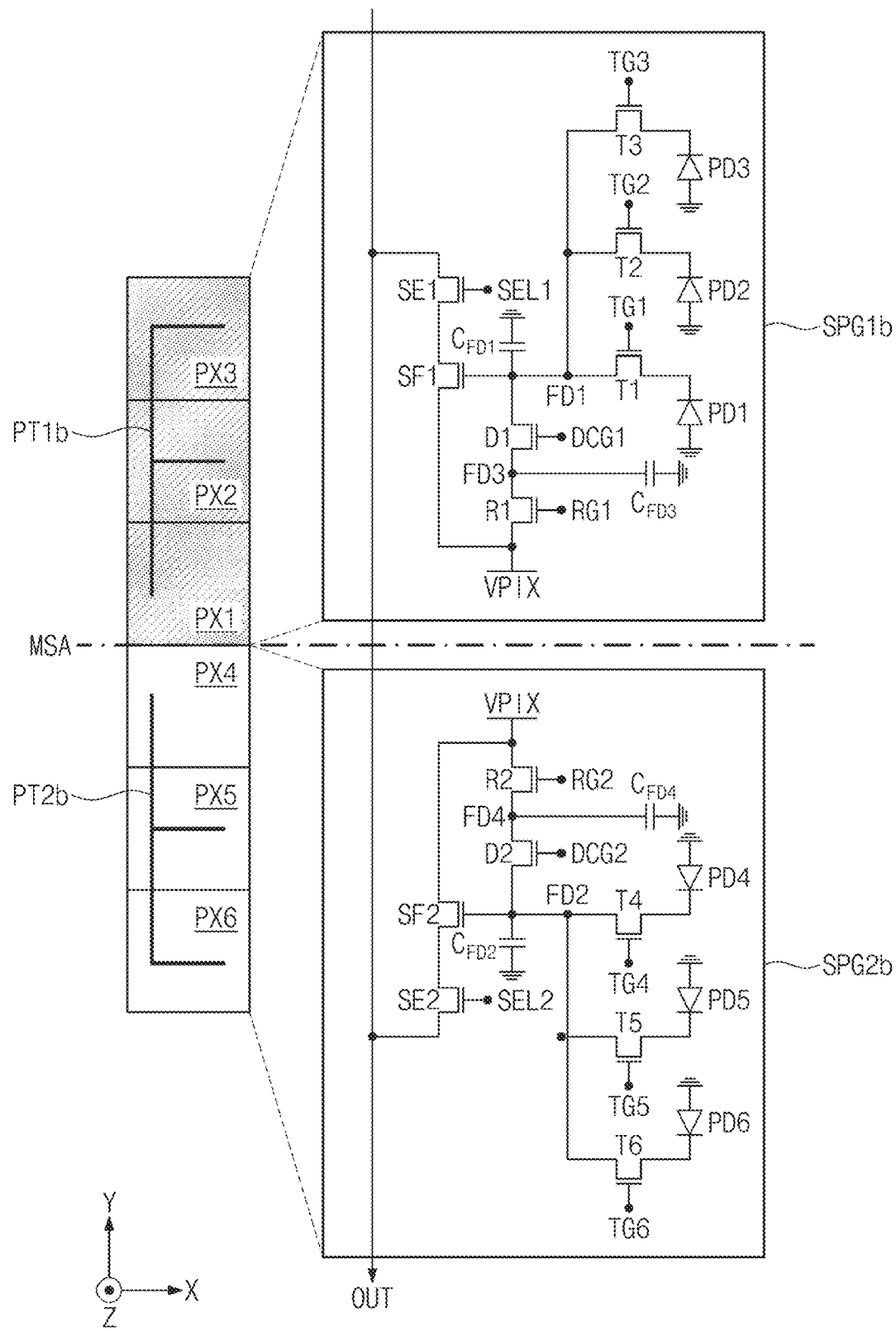
FIG. 4 illustrates a circuit diagram and a layout of a unit pixel group of FIG. 1, according to at least one example embodiment of the inventive concepts.

FIG. 4 illustrates a circuit diagram and a layout of a unit pixel group of FIG. 1, according to at least one example embodiment of the inventive concepts. A unit pixel group UPGb may be an example of the unit pixel group UPG of FIG. 1, but is not limited thereto. The unit pixel group UPGb may include shared pixel groups SPG1b and SPG2b, etc., and the description of FIG. 4 will be focused on differences between the unit pixel group UPGb and the unit pixel group UPGa. The unit pixel group UPGb is substantially identical to the unit pixel group UPGa except for example, that the shared pixel groups SPG1b and SPG2b further include dual conversion transistors D1 and D2, and second floating diffusion areas FD3 and FD4, respectively.

According to at least one example embodiment, the dual conversion transistor D1 may be connected between the floating diffusion area FD1 and the reset transistor R1. The dual conversion transistor D1 may electrically connect a plurality of floating diffusion areas, e.g., FD1 and FD3, etc., based on a dual conversion gate signal DCG1. For example, the floating diffusion area FD3 may be electrically connected with the floating diffusion area FD1 through the dual conversion transistor D1. When the dual conversion transistor D1 is turned off, a full well capacity (FWC) of the shared pixel group SPG1b may be the capacitance CFD1 of the floating diffusion area FD1. When the dual conversion transistor D1 is turned on, the FWC of the shared pixel group SPG1b may be a sum of the capacitances $C_{FD1}$ and $C_{FD3}$ of and/or associated with the floating diffusion areas FD1 and FD3. For example, when the image sensor 100a operates under a low-illuminance condition, the dual conversion transistor D1 may be turned off (i.e., the FWC of the shared pixel group SPG1b may relatively decrease in comparison to the FWC of the shared pixel group SPG1b during higher illuminance conditions, etc.), and thus, a conversion gain (e.g., a unit of the conversion gain being μV/e−) of the shared pixel group SPG1b may relatively increase. When the image sensor 100a operates under a high-illuminance condition, the dual conversion transistor D1 may be turned on (i.e., the FWC of the shared pixel group SPG1b may relatively increase in comparison to the FWC of the shared pixel group SPG1b lower illuminance conditions, etc.), and thus, the conversion gain of the shared pixel group SPG1b may relatively decrease. The dual conversion transistor D1 may vary the conversion gain of the shared pixel group SPG1b based on the dual conversion gate signal DCG1. The dual conversion transistor D2 may be connected between the floating diffusion area FD2 and the reset transistor R2. The dual conversion transistor D2 may electrically connect a plurality of floating diffusion areas, e.g., FD2 and FD4, etc., having capacitances CFD2 and CFD4 based on a dual conversion gate signal DCG2. As in the dual conversion transistor D1, the dual conversion transistor D2 may vary a conversion gain of the shared pixel group SPG2b in response to the dual conversion gate signal DCG2 (e.g., $C_{FD2} \rightarrow C_{FD2}+C_{FD4}$ or $C_{FD2}+C_{FD4} \rightarrow C_{FD2}$). According to at least one example embodiment, the variation in the FWC of the shared pixel group SPG1b by the dual conversion transistor D1 may be "$C_{FD3}$", and the variation in the FWC of the shared pixel group SPG2b by the dual conversion transistor D2 may be "$C_{FD4}$".

Compared to the layout pattern PT1a, a layout pattern PT1b may further include an area where the dual conversion transistor D1 is formed, implemented, and/or located, terminals of the dual conversion transistor D1, metal wires for electrically connecting the above terminals, vias for electrically connecting at least two of the metal wires and the terminals, and/or junctions, etc. Compared to the layout pattern PT2a, a layout pattern PT2b may further include an area where the dual conversion transistor D2 is formed, implemented, and/or located, terminals of the dual conversion transistor D2, metal wires for electrically connecting the above terminals, vias for electrically connecting at least two of the metal wires and the terminals, and/or junctions, etc. The layout patterns PT1b and PT2b may be mirror-symmetric with respect to at least one axis, e.g., the X-axis, and the shared pixel group SPG1b and the shared pixel group SPG2b may be mirror-symmetric with respect to at least one axis, e.g., the X-axis, and may share the same output line.

Figure 5:
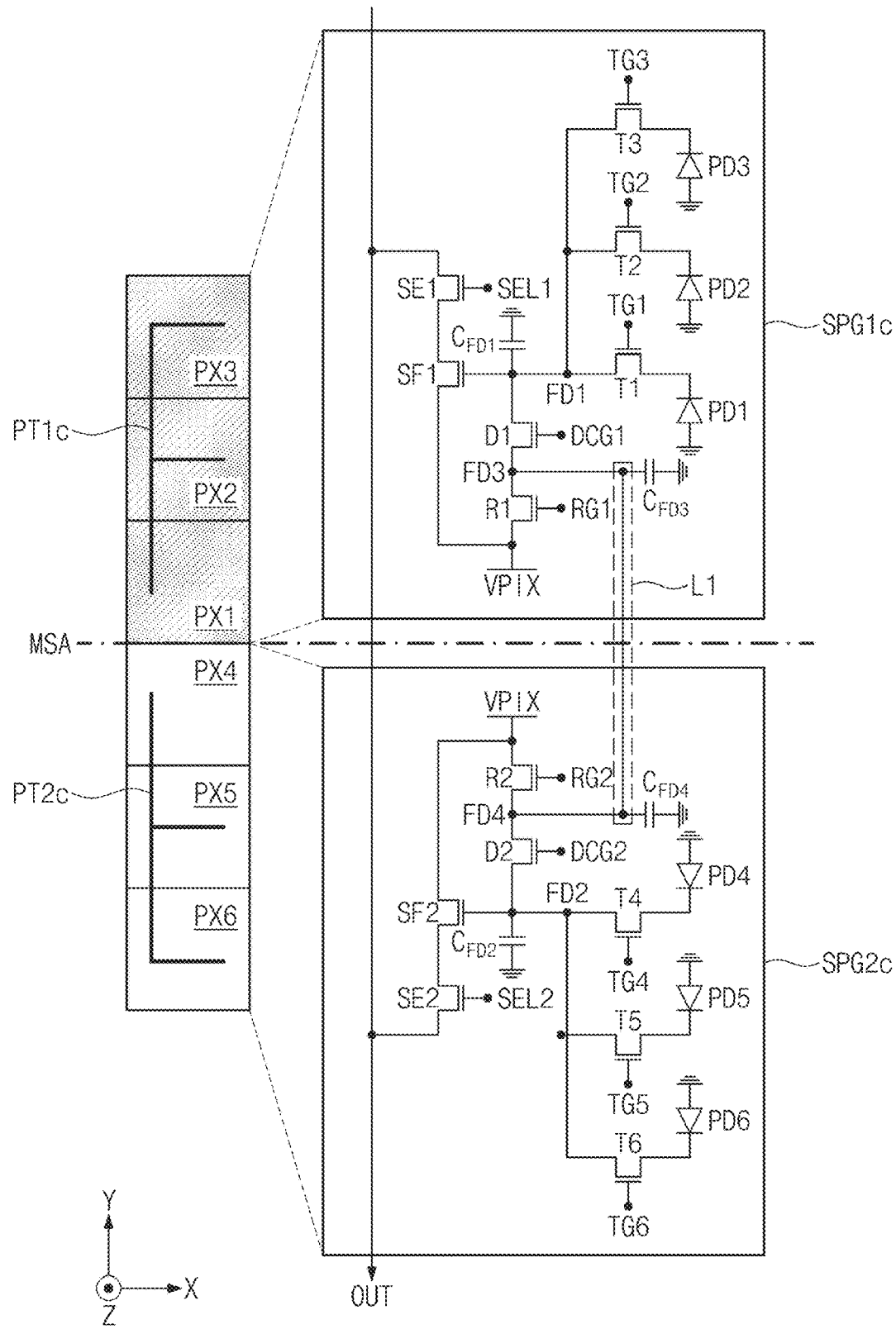
FIG. 5 illustrates a circuit diagram and a layout of a unit pixel group of FIG. 1, according to at least one example embodiment of the inventive concepts.

FIG. 5 illustrates a circuit diagram and a layout of a unit pixel group of FIG. 1, according to at least one example embodiment of the inventive concepts. A unit pixel group UPGc may be an example of the unit pixel group UPG of FIG. 1, but is not limited thereto. The unit pixel group UPGc may include shared pixel groups SPG1c and SPG2c, etc., and the description will be focused on differences between the unit pixel group UPGb and the unit pixel group UPGc. Compared with the unit pixel group UPGb, the unit pixel group UPGc may further include a metal wire L1 electrically connecting the floating diffusion areas FD3 and FD4, but is not limited thereto.

For example, according to at least on example embodiment, when the dual conversion gate signal DCG1 is enabled, the dual conversion transistor D1 may be turned on, and the FWC of the shared pixel group SPG1c may be, e.g., "$C_{FD1}+C_{FD3}+C_{FD4}$". When the dual conversion gate signal DCG2 is enabled, the dual conversion transistor D2 may be turned on, and the FWC of the shared pixel group SPG2c may be, e.g., "$C_{FD2}+C_{FD4}+C_{FD3}$". However, the example embodiments are not limited thereto, and the FWC of the shared pixel group SPG1c may vary and/or range from "$C_{FD1}$" to "$C_{FD1}+C_{FD3}+C_{FD4}$", and the FWC of the shared pixel group SPG2c may vary and/or range from "$C_{FD2}$" to "$C_{FD2}+C_{FD4}+C_{FD3}$". The variation in the FWC of the shared pixel group SPG1c by the dual conversion transistor D1 and the metal wire L1 may be "$C_{FD3}+C_{FD4}$", and the variation in the FWC of the shared pixel group SPG2c by the dual conversion transistor D2 and the metal wire L1 may be "$C_{FD3}+C_{FD4}$". "$C_{FD3}+C_{FD4}$" may include a capacitance of the metal wire L1. Compared with the layout patterns PT1b and PT2b, a layout pattern PT1c may further include a portion of the metal line L1, and a layout pattern PT2c may further include the remaining portion of the metal wire L1. The layout patterns PT1c and PT2c may be mirror-symmetric with respect to an axis, such as the X-axis.

Because the shared pixel group SPG1c and the shared pixel group SPG2c are mirror-symmetric with respect to, e.g., the X-axis, the floating diffusion areas FD3 and FD4 may be adjacent to each other with respect to the same axis, e.g., the X-axis. Accordingly, a length of the metal wire L1 electrically connecting the plurality of floating diffusion areas, e.g., FD3 and FD4, may become short (e.g., shorter, etc.) compared to the case where the shared pixel group SPG2c is implemented by moving the shared pixel group SPG1c in parallel along the Y-axis (i.e., the case where the shared pixel groups SPG1c and SPG2c are not mirror-symmetric with each other). The plurality of reset transistors R1 and R2 may be adjacent to each other with respect to the X-axis, and the plurality of dual conversion transistors D1 and D2 may be adjacent to each other with respect to the X-axis. For example, the plurality of floating diffusion areas FD3 and FD4, the metal wire L1 electrically connecting the plurality of floating diffusion areas FD3 and FD4, the plurality of reset transistors R1 and R2, and the plurality of dual conversion transistors D1 and D2 may be arranged within a central area of the unit pixel group UPGc, which includes the mirror-symmetric axis MSA, but are not limited thereto. Because the adjacent floating diffusion areas FD3 and FD4 are electrically connected through the metal wire L1, the FWC of the shared pixel group SPG1c may be expanded to the floating diffusion area FD4 of the adjacent shared pixel group SPG2c, or the FWC of the shared pixel group SPG2c may be expanded to the floating diffusion area FD3 of the adjacent shared pixel group SPG1c.

Figure 6:
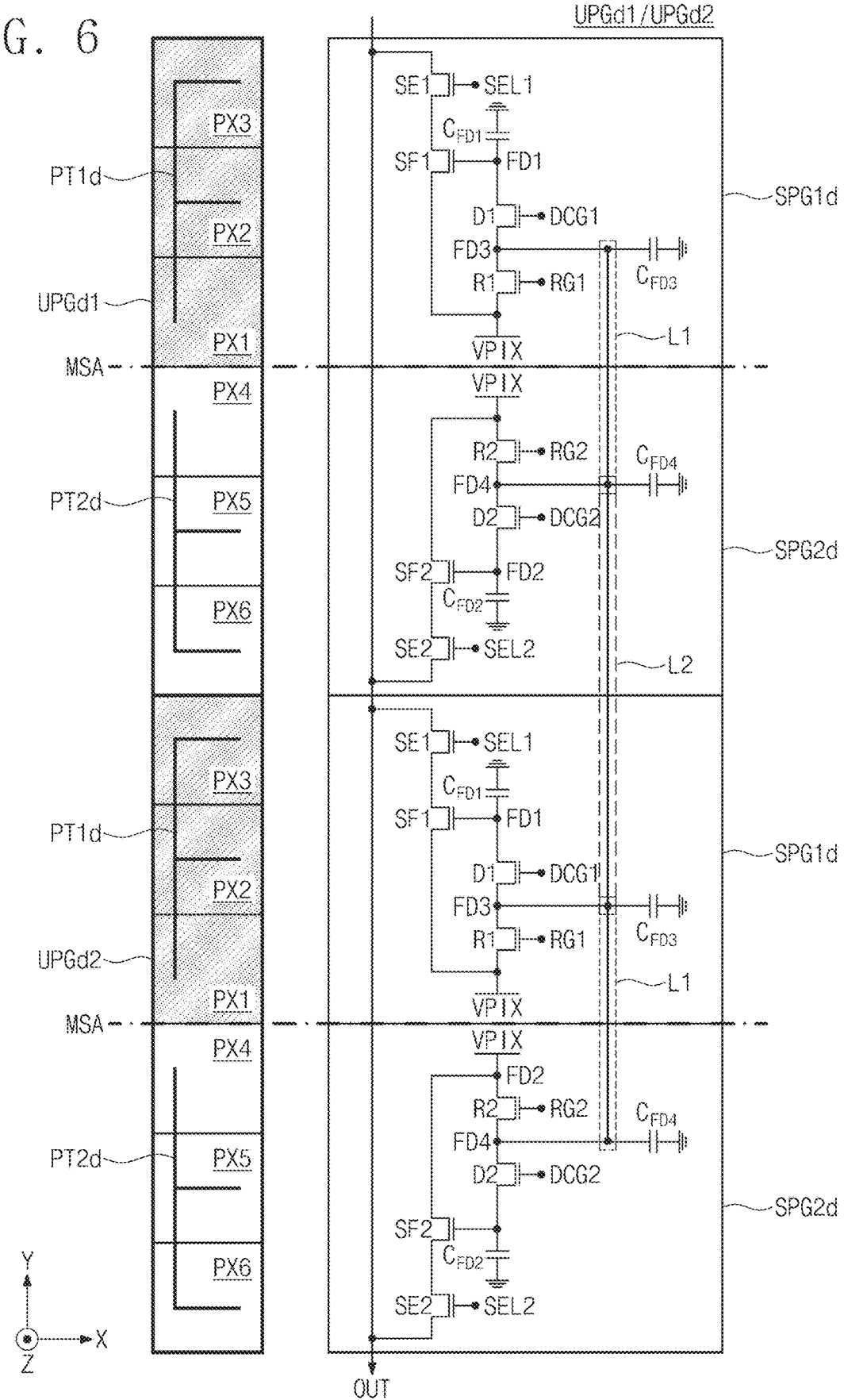
FIG. 6 illustrates circuit diagrams and layouts of unit pixel groups of FIG. 1, according to at least one example embodiment of the inventive concepts.

FIG. 6 illustrates circuit diagrams and layouts of unit pixel groups of FIG. 1, according to at least one example embodiment of the inventive concepts. Each of the plurality of unit pixel groups UPGd1 and UPGd2 may be an example of the unit pixel group UPG of FIG. 1, but are not limited thereto. The unit pixel group UPGd1 may include shared pixel groups SPG1d and SPG2d, etc. The unit pixel group UPGd2 may be substantially identical to the unit pixel group UPGd1, but is not limited thereto. In the case where the unit pixel group UPGd1 moves in parallel along the Y-axis, the unit pixel group UPGd1 may overlap the unit pixel group UPGd2 in a plan view. The description will be focused on differences between the unit pixel groups UPGd1 and UPGd2 and the unit pixel group UPGc according to at least one example embodiment. Compared with the unit pixel group UPGc, the plurality of unit pixel groups UPGd1 and UPGd2 may further include a metal wire L2 electrically connecting the plurality of floating diffusion areas FD3 and FD4 of the unit pixel group UPGd1 and the plurality of floating diffusion areas FD3 and FD4 of the unit pixel group UPGd2. For convenience of illustration, the transfer transistors T1 to T5 and the photoelectric conversion elements PD1 to PD6 of the unit pixel groups UPGd1 and UPGd2 are omitted. Layout patterns PT1d and PT2d may be substantially identical to the layout patterns PT1c and PT2c, and the metal wire L2 may be added to the unit pixel groups UPGd1 and UPGd2 in addition to the layout patterns PT1d and PT2d, but are not limited thereto.

For example, when the dual conversion gate signal DCG1 applied to the dual conversion transistor D1 of the unit pixel group UPGd1 is enabled, the dual conversion transistor D1 may be turned on in response to the dual conversion gate signal DCG1, and the FWC of the shared pixel group SPG1d of the unit pixel group UPGd1 may be "$C_{FD1}+2\ C_{FD3}+2\ C_{FD4}$". When the dual conversion gate signal DCG2 applied to the dual conversion transistor D2 of the unit pixel group UPGd1 is enabled, the dual conversion transistor D2 may be turned on in response to the dual conversion gate signal DCG2, and the FWC of the shared pixel group SPG2d of the unit pixel group UPGd1 may be "$C_{FD2}+2\ C_{FD3}+2\ C_{FD4}$". The FWC of the shared pixel group SPG1d may vary and/or range from "$C_{FD1}$" to "$C_{FD1}+2\ C_{FD3}+2\ C_{FD4}$", and the FWC of the shared pixel group SPG2d may vary and/or range from "$C_{FD2}$" to "$C_{FD2}+2\ C_{FD4}+2\ C_{FD3}$". The variation (e.g., range of values) in the FWC of the shared pixel group SPG1d by the dual conversion transistor D1 and the metal wires L1 and L2 may be "2 $C_{FD3}$+2 $C_{FD4}$", and the variation (e.g., range of values) in the FWC of the shared pixel group SPG2d by the dual conversion transistor D2 and the metal wires L1 and L2 may be "2 $C_{FD3}$+2 $C_{FD4}$". "2 $C_{FD3}$+2 $C_{FD4}$" may include capacitances of the metal wires L1 and L2, but are not limited thereto.

In addition to the unit pixel groups UPGd1 and UPGd2, a new unit pixel group(s) substantially identical to each of the unit pixel groups UPGd1 and UPGd2 may be further arranged along the Y-axis. The metal wire L2 electrically connecting the new unit pixel group(s) and the plurality of floating diffusion areas FD3 and FD4 of the unit pixel groups UPGd1 and UPGd2 may be further arranged. For example, the variation in the FWC of each of the shared pixel groups SPG1d and SPG2d by the dual conversion transistor D1/D2 and the metal wires L1 and L2 may be "N×$C_{FD3}$+N×$C_{FD4}$" (N being an integer of 2 or more), etc.

Figure 7:
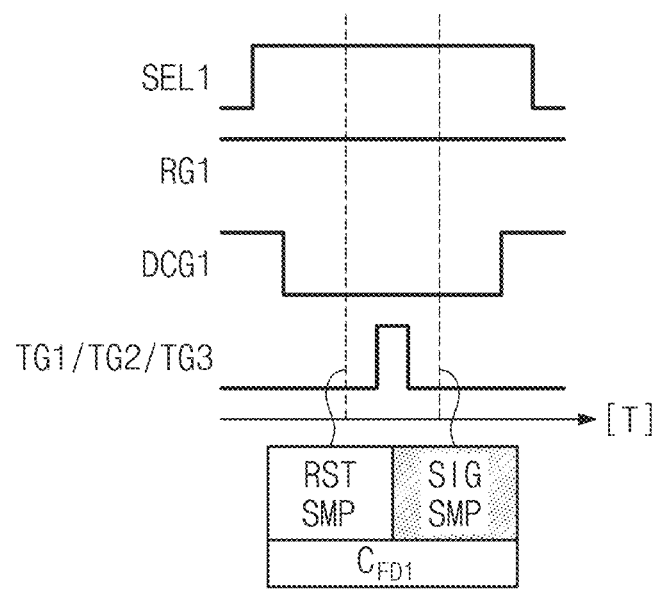
FIGS. 7 to 10 are timing diagrams illustrating waveforms of signals applied to a unit pixel group of FIG. 5 according to some example embodiments.

FIGS. 7 to 10 are timing diagrams illustrating waveforms of signals applied to a unit pixel group of FIG. 5 according to some example embodiments. FIGS. 7 to 10 will be described together with reference to FIG. 5. FIG. 7 relates to the case where the FWC of the shared pixel group SPG1c is "$C_{FD1}$", FIG. 8 relates to the case where the FWC of the shared pixel group SPG1c "$C_{FD1}$+$C_{FD3}$+$C_{FD4}$", and FIGS. 9 and 10 relate to the case where the FWC of the shared pixel group SPG1c "$C_{FD1}$+$C_{FD3}$+$C_{FD4}$+$C_{FD2}$", however the example embodiments are not limited thereto. Waveforms of FIGS. 7 to 10 may indicate a readout period of the shared pixel group SPG1c according to some example embodiments.

Referring to FIG. 7, during the readout period of the shared pixel group SPG1c, the reset signal RG1 may be enabled, a voltage (e.g., voltage level, value, magnitude, etc.) of the plurality of floating diffusion area FD3 may be the power supply voltage VPIX, and the floating diffusion area FD1 may not be electrically connected with the floating diffusion area FD3. During a period where the selection signal SEL1 is enabled and the dual conversion gate signal DCG1 is disabled, at least one of the plurality of transfer gate signals TG1 to TG3 may be enabled and may then be disabled. After the selection signal SEL1 is enabled and the dual conversion gate signal DCG1 is disabled, and before at least one of the plurality of transfer gate signals TG1 to TG3 is enabled, the readout circuit (e.g., R1, SF1, SE1) of the shared pixel group SPG1c may sample and/or output a reset voltage level of the floating diffusion area FD1 (RST SMP). After at least one of the plurality of transfer gate signals TG1 to TG3 is enabled and is then disabled, the readout circuit (e.g., R1, SF1, SE1) of the shared pixel group SPG1c may sample and/or output a signal voltage level of the floating diffusion area FD1 (SIG SMP).

Figure 8:
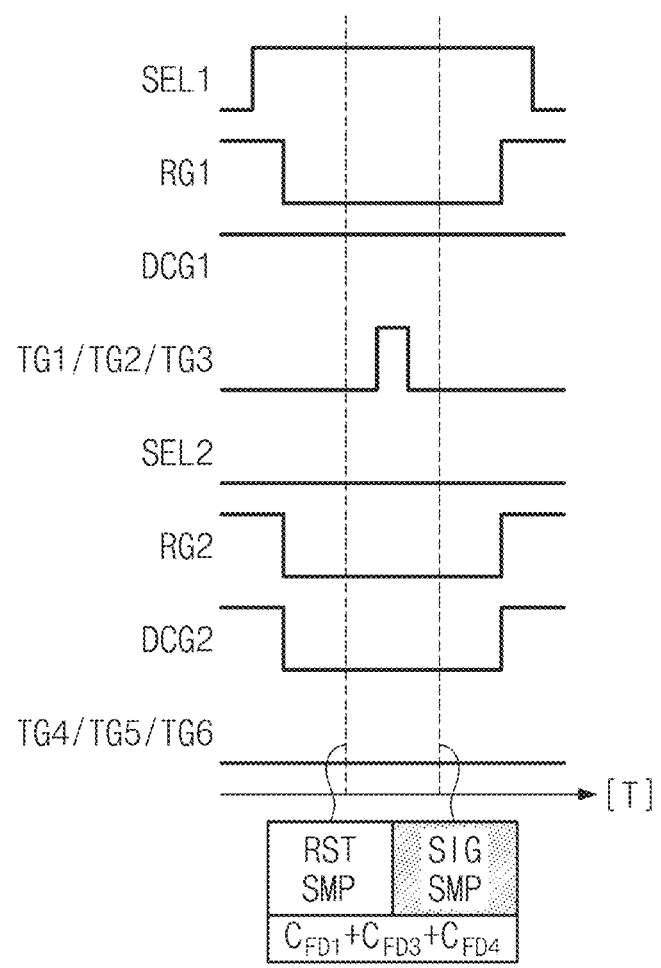

Referring to FIG. 8, during the readout period of the shared pixel group SPG1c, the dual conversion gate signal DCG1 may be enabled, and the floating diffusion area FD1 may be electrically connected with the plurality of floating diffusion areas FD3 and FD4. During a period where the selection signal SEL1 is enabled and the reset signal RG1 is disabled, at least one of the plurality of transfer gate signals TG1 to TG3 may be enabled and may then be disabled. After the selection signal SEL1 is enabled and the reset signal RG1 is disabled, and before at least one of the plurality of transfer gate signals TG1 to TG3 is enabled, the readout circuit (e.g., R1, SF1, SE1) of the shared pixel group SPG1c may sample and/or output a reset voltage level of the plurality of floating diffusion areas FD1, FD3, and FD4 (RST SMP). After at least one of the plurality of transfer gate signals TG1 to TG3 is enabled and is then disabled, the readout circuit (e.g., R1, SF1, SE1) of the shared pixel group SPG1c may sample and/or output a signal voltage level of the floating diffusion areas FD1, FD3, and FD4 (SIG SMP). At the sampling times of the RST SMP and SIG SMP signals, because the dual conversion gate signal DCG1 is enabled, the reset signal RG2 is disabled, and the dual conversion gate signal DCG2 is disabled, and the floating diffusion area FD1 is electrically connected with the floating diffusion areas FD3 and FD4 but is not electrically connected with the floating diffusion area FD2. During the readout period of the shared pixel group SPG1c, the selection signal SEL2 and the transfer gate signals TG4 to TG6 may be disabled.

Figure 9:
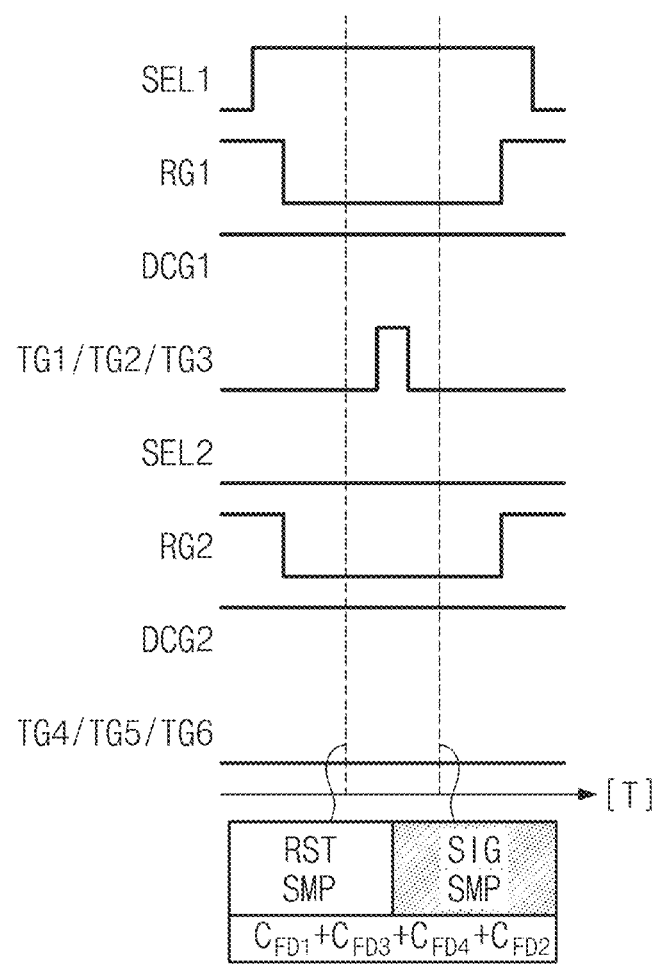

Referring to FIG. 9, during the readout period of the shared pixel group SPG1c, the dual conversion gate signals DCG1 and DCG2 may be enabled, and the floating diffusion area FD1 may be electrically connected with the plurality of floating diffusion areas FD3, FD4, and FD2. During a period where the selection signal SEL1 is enabled and the reset signal RG1 is disabled, at least one of the plurality of transfer gate signals TG1 to TG3 may be enabled and may then be disabled. After the selection signal SEL1 is enabled and the reset signal RG1 is disabled, and before at least one of the plurality of transfer gate signals TG1 to TG3 is enabled, the readout circuit (e.g., R1, SF1, SE1) of the shared pixel group SPG1c may sample and/or output a reset voltage level of the plurality of floating diffusion areas FD1, FD3, FD4, and FD2 (RST SMP). After at least one of the plurality of transfer gate signals TG1 to TG3 is enabled and is then disabled, the readout circuit (e.g., R1, SF1, SE1) of the shared pixel group SPG1c may sample and/or output a signal voltage level of the plurality of floating diffusion areas FD1, FD3, FD4, and FD2 (SIG SMP). During the readout period of the shared pixel group SPG1c, the selection signal SEL2 and the plurality of transfer gate signals TG4 to TG6 may be disabled.

Figure 10:
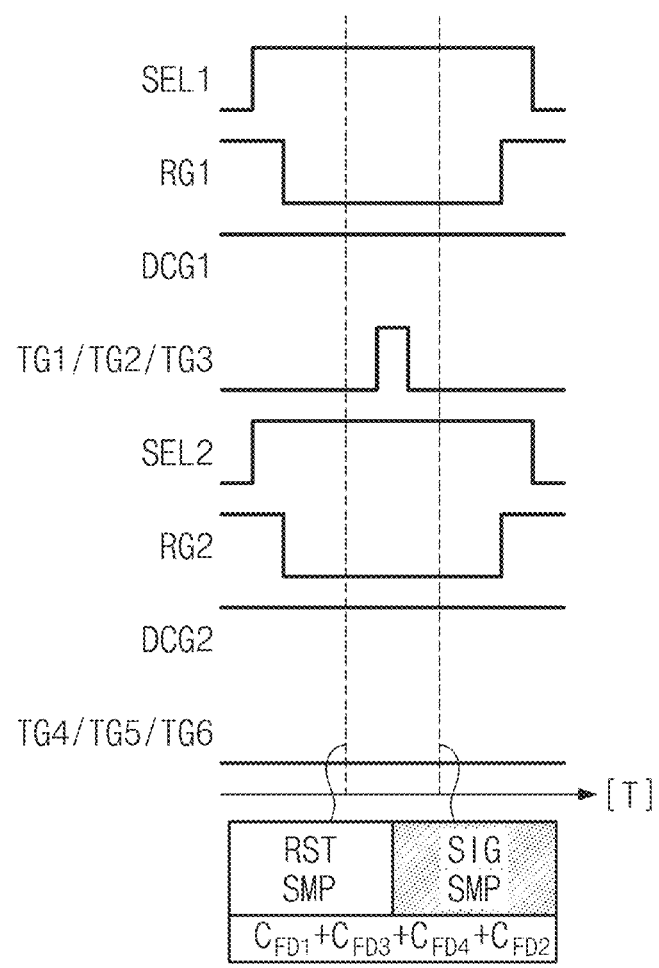

Waveforms of FIG. 10 may be substantially identical to waveforms of FIG. 9 except for the selection signal SEL2, but are not limited thereto. During the readout period of the shared pixel group SPG1c, like the selection signal SEL1, the selection signal SEL2 may be enabled and may then be disabled. The readout circuit (e.g., R1, SF1, SE1) of the shared pixel group SPG1c and the readout circuit (e.g., R2, SF2, SE2) of the shared pixel group SPG2c may sample and/or output a reset voltage level of the plurality of floating diffusion areas FD1, FD3, FD4, and FD2 (RST SMP). The readout circuit (e.g., R1, SF1, SE1) of the shared pixel group SPG1c and the readout circuit (e.g., R2, SF2, SE2) of the shared pixel group SPG2c may sample and/or output a signal voltage level of the plurality of floating diffusion areas FD1, FD3, FD4, and FD2 (SIG SMP). The two read circuits (e.g., R1, SF1, SE1) and (e.g., R2, SF2, SE2) may simultaneously drive one output line based on a voltage level of the plurality of floating diffusion areas FD1, FD3, FD4, and FD2 electrically connected with each other. One readout circuit (e.g., R1, SF1, SE1) may be connected with one output line in the case of FIG. 9, and two read circuits (e.g., R1, SF1, SE1) and (e.g., R2, SF2, SE2) may be connected with one output line in the case of FIG. 10. That is, as the selection signal SEL2 is enabled, the area of the source follower transistor associated with the output line may increase (e.g., SF1→SF1+SF2), and a transconductance gm of the source follower transistor may increase. Accordingly, a random telegraph signal (RTS) noise may decrease.

Figure 11:
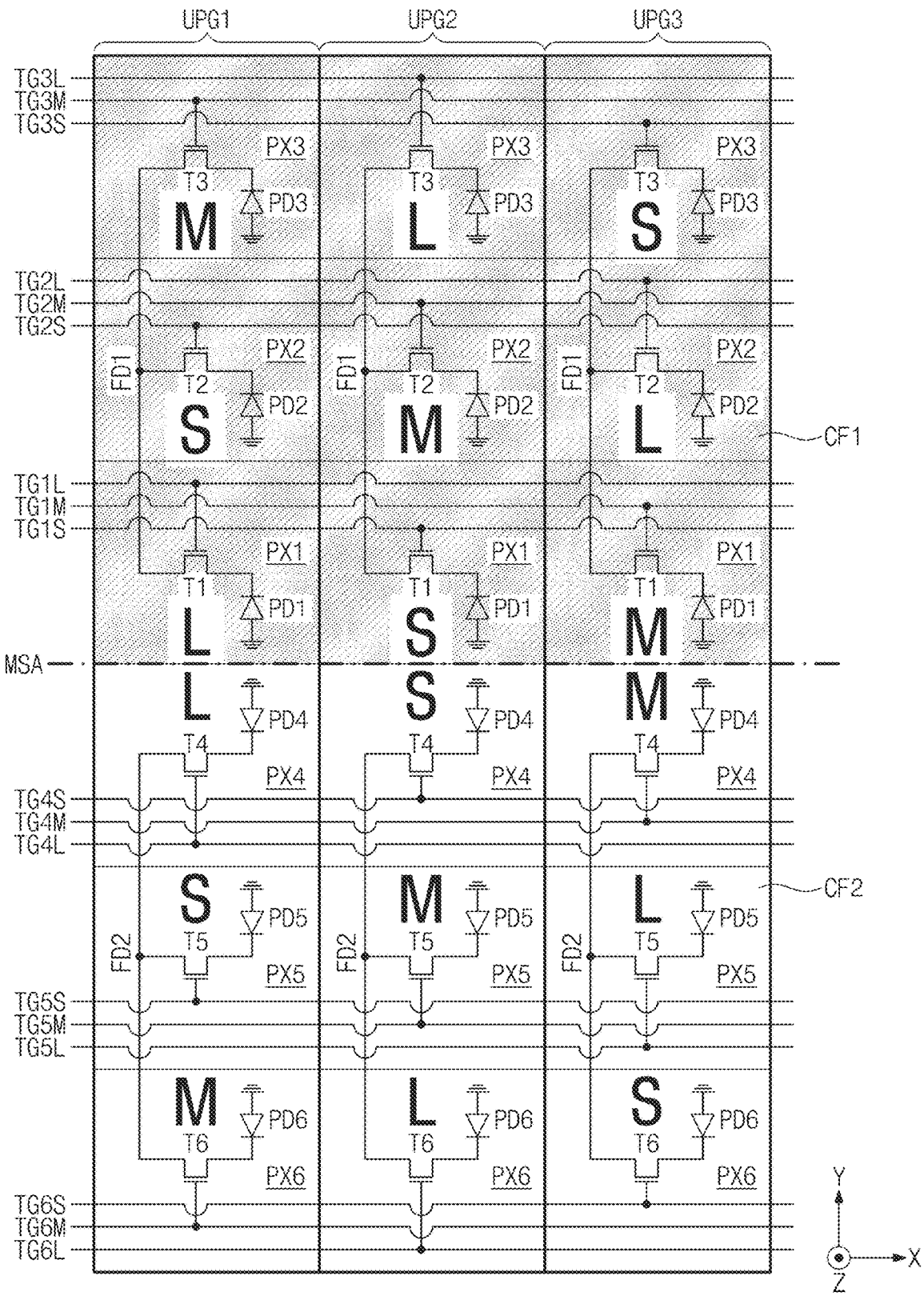
FIG. 11 illustrates some pixel groups of an image sensor of FIG. 1, according to at least one example embodiment of the inventive concepts.

FIG. 11 illustrates some pixel groups of an image sensor of FIG. 1, according to at least one example embodiment of the inventive concepts. The pixel groups PG1 and PG2 may include "3×1" unit pixel groups UPG1 to UPG3, but are not limited thereto. The 3 unit pixel groups UPG1 to UPG3 repeatedly arranged along the X-axis may constitute the pixel groups PG1 and PG2 of FIG. 1, but are not limited thereto. As described above, the color filters CF1 may be on the pixel group PG1, and the color filters CF2 may be on the pixel group PG2. A plurality of photoelectric conversion elements PD1 to PD6, the plurality of transfer transistors T1 to T6, and the plurality of floating diffusion areas FD1 and FD2 of the "1×6" pixels PX1 to PX6 are only illustrated in FIG. 11, but the example embodiments are not limited thereto. For the sake of clarity of illustration, the remaining components R1, R2, SF1, SF2, SE1, SE2, etc., are omitted in FIG. 11.

A plurality of transfer gate signals TG3M, TG3L, and TG3S, etc., may be respectively applied to a plurality of gate terminals of the plurality of transfer transistors T3 of the "3×1" pixels PX3 of the unit pixel groups UPG1 to UPG3. The plurality of transfer gate signals TG3M, TG3L, and TG3S, etc., may be switched (e.g., enabled, turned on, etc.) depending on different effective integration times (EIT) (hereinafter referred to as an "integration time") of the corresponding pixel(s). The integration time may be an exposure time of the pixels, etc. "M", "L", and "S" that are marked at pixels and are included in reference symbols of transfer gate signals may indicate lengths of the different integration times, respectively. For example, "L" (long) may indicate the longest integration time, "S" (short) may indicate the shortest integration time, and "M" (middle) may indicate a middle integration time between "L" and "S", however the example embodiments are not limited thereto. The pixel PX3 (M) of the unit pixel group UPG1 may convert a light incident during the relatively middle integration time into an electrical signal, the pixel PX3 (L) of the unit pixel group UPG2 may convert a light incident during the relatively long integration time into an electrical signal, and the pixel PX3 (S) of the unit pixel group UPG3 may convert a light incident during the relatively short integration time into an electrical signal, but the example embodiments are not limited thereto, and the unit pixel groups may have different integration times.

According to at least one example embodiments, a plurality of transfer gate signals TG1S to TG6S, etc., may be respectively switched depending on and/or based on integration times that are identical and are relatively short, but are not limited thereto, and for example the integration times may be not identical and/or may have different time lengths. The transfer gate signals TG1M to TG6M may be respectively switched based on and/or depending on integration times that are identical and are relatively middle, but the example embodiments are not limited thereto, and for example the integration times may be not identical and/or may have different time lengths. Transfer gate signals TG1L to TG6L may be respectively switched based on and/or depending on integration times that are identical and are relatively long, but the example embodiments are not limited thereto, and for example the integration times may be not identical and/or may have different time lengths. Transfer gate signals TG2S, TG2M, and TG2L may be respectively applied to gate terminals of the transfer transistors T2 of the pixels PX2 of the unit pixel groups UPG1 to UPG3. Transfer gate signals TG1L, TG1S, and TG1M may be respectively applied to gate terminals of the transfer transistors T1 of the pixels PX1 of the unit pixel groups UPG1 to UPG3. Transfer gate signals TG4L, TG4S, and TG4M may be respectively applied to gate terminals of the transfer transistors T4 of the pixels PX4 of the unit pixel groups UPG1 to UPG3. Transfer gate signals TG5S, TG5M, and TG5L may be respectively applied to gate terminals of the transfer transistors T5 of the pixels PX5 of the unit pixel groups UPG1 to UPG3. Transfer gate signals TG6M, TG6L, and TG6S may be respectively applied to gate terminals of the transfer transistors T6 of the pixels PX6 of the unit pixel groups UPG1 to UPG3.

The transfer transistors T1 and T4 being mirror-symmetric with respect to an axis, such as the X-axis, etc., from among the transfer transistors T1 to T6 of the unit pixel group UPG1 may receive the transfer gate signals TG1L and TG4L respectively switched based on and/or depending on a relatively long integration time, but is not limited thereto. In other words, the mirror symmetric transfer transistors T1 and T4 may have similar integration times based on their arrangement and/or layout in the image sensor. The transfer transistors T2 and T5 being mirror-symmetric with respect to an axis, such as the X-axis, from among the transfer transistors T1 to T6 of the unit pixel group UPG1 may receive the transfer gate signals TG2S and TG5S respectively switched based on and/or depending on a relatively short integration time, but is not limited thereto. In other words, the mirror symmetric transfer transistors T2 and T5 may have similar integration times based on their arrangement and/or layout in the image sensor. The transfer transistors T3 and T6 being mirror-symmetric with respect to an axis, such as the X-axis, from among the transfer transistors T1 to T6 of the unit pixel group UPG1 may receive the transfer gate signals TG3M and TG6M respectively switched based on and/or depending on a relatively middle integration time, but is not limited thereto. In other words, the mirror symmetric transfer transistors T3 and T6 may have similar integration times based on their arrangement and/or layout in the image sensor. Transfer transistors being mirror-symmetric with respect to an axis, such as the X-axis, from among "1×6" pixels PX1 to PX6 of each of the remaining unit pixel groups UPG2 and UPG3 may also receive transfer gate signals respectively switched based on and/or depending on the same integration time, but is not limited thereto.

Referring to FIG. 11, lines passing through the plurality of pixels, such as PX1 to PX6, along an axis of the image sensor, such as the X-axis, may indicate a plurality of transfer gate lines through which the plurality of transfer gate signals TG1S to TG6S, TG1M to TG6M, and/or TG1L to TG6L, etc., are transferred. As illustrated in FIG. 11, each of the plurality of transfer transistors T1 to T6 may be connected with one of the plurality of transfer gate lines for the purpose of receiving the corresponding transfer gate signal. For example, in the case where the unit pixel group UPG1 includes "1×2N" pixels PX1 to PX6, the "1×2N" transfer transistors T1 to T6 of the "1×2N" pixels PX1 to PX6 may respectively receive "1×2N" transfer gate signals TG1L, TG2S, TG3M, TG4L, TG5S, and TG6M through "1×2N" transfer gate lines, and each of the "1×2N" transfer gate signals TG1L, TG2S, TG3M, TG4L, TG5S, and TG6M may be switched based on and/or depending on one of "N" integration times (e.g., the shortest integration time, the middle integration time, and/or the longest integration time, etc.).

Although not illustrated in FIG. 11, referring to FIGS. 3 to 11 together, one selection signal SEL1 may be applied in common to three selection transistors SE1 of the pixel group PG1 through one selection line (not illustrated), and the one selection line may be connected in common with and/or to all of the three selection transistors SE1. One reset signal RG1 may be applied in common to and/or applied to all of the three reset transistors R1 of the pixel group PG1 through one reset line (not illustrated), and the one reset line may be connected in common with and/or applied to all of the three reset transistors R1, etc. One dual conversion gate signal DCG1 may be applied in common to three dual conversion transistors D1 of the pixel group PG1 through one dual conversion line (not illustrated), and the dual conversion line may be connected in common with and/or applied to all of the three dual conversion transistors D1, etc. The above signals and the lines through which the signals are transferred relate to the pixel group PG1, but the above signals and lines may be identically adopted to implement the pixel group PG2, but the example embodiments are not limited thereto.

In at least one example embodiment, the "1×3" pixels PX1 to PX3 of each of the shared pixel groups SPG1a to SPG1c (e.g., refer to FIGS. 3 to 5) may have different integration times, and the "1×3" pixels PX4 to PX6 of each of the shared pixel groups SPG2a to SPG2c (e.g., refer to FIGS. 3 to 5) may have different integration times, but the example embodiments are not limited thereto. "3×1" pixels PX1, PX2, PX3, PX4, PX5, or PX6 arranged along an axis, such as the X-axis, may have different integration times. For example, in "3×3" pixels of each of the pixel groups PG1 and PG2, three pixels PX1 to PX3 have a relatively long integration time, three pixels PX1 to PX3 have a relatively middle integration time, and three pixels PX1 to PX3 have a relatively short integration time, etc. As another example, in the case where each of the pixel groups PG1 and PG2 includes "M×M" pixels, "1×M" pixels arranged along a first axis, e.g., the X-axis, from among the "M×M" pixels may respectively receive "M" transfer gate signals respectively switched depending on "M" integration signals. "M×1" pixels arranged along a second axis, e.g., the Y-axis, from among the "M×M" pixels may respectively receive "M" transfer gate signals respectively switched depending on "M" integration signals, etc. "M" pixels of the "M×M" pixels may receive transfer gate signals switched based on and/or depending on one of the "M" integration signals, etc.

A dynamic range of the image sensor 100a may be a ratio of the smallest input signal capable of being detected by the pixels of the image sensor 100a, and the greatest input signal capable of being detected by the pixels of the image sensor 100a that is not saturated. As the dynamic range becomes wider (or higher), the image sensor 100a may appropriately express both a dark portion and a bright portion on one sheet (e.g., a frame of an image, etc.). According to at least one example embodiment, because each of the pixel groups PG1 and PG2 includes pixels having the shortest integration time, pixels having the middle integration time, and pixels having the longest integration time, compared to the case where all of the pixels of the image sensor have the same integration time, the image sensor 100a may support a wide dynamic range (WDR) mode and/or a high dynamic range (HDR) mode, but is not limited thereto. As described above, according to at least one example embodiment, the shared pixel groups SPG1a to SGP1c (e.g., PX1 to PX3) of each of the unit pixel groups UPG1 to UPG3 and the shared pixel groups SPG2a to SGP2c (e.g., PX4 to PX6) of each of the unit pixel groups UPG1 to UPG3 may be mirror-symmetric with respect to an axis, such as the X-axis, etc. Also, for example, a WDR pattern (which refers to "S", "M", and "L" of the pixels PX1 to PX3) of integration times (e.g., a plurality of integration times) that the pixels PX1 to PX3 of the pixel group PG1 have, and a WDR pattern (which refers to "S", "M", and "L" of the pixels PX4 to PX6) of integration times (e.g., a plurality of integration times) that the pixels PX4 to PX6 of the pixel group PG2 have may be mirror-symmetric with respect to an axis of the image sensor, such as the X-axis.

Although not illustrated in FIG. 11, referring to FIGS. 1 and 11, according to at least one example embodiment, the pixel group PG3 may be adjacent to the pixel group PG1 along, e.g., the X-axis, and the pixel group PG4 may be adjacent to the pixel group PG2 along, e.g., the X-axis. The pixel group PG3 is substantially identical to the pixel group PG1 except that the color filters on the pixel group PG3 are the color filters CF2, not the color filters CF1, but the example embodiments are not limited thereto. As in the above description, the pixel group PG4 is substantially identical to the pixel group PG2 except that the color filters CF3 are on the pixel group PG4, not the color filters CF2, but the example embodiments are not limited thereto. The WDR pattern of integration times that pixels of the pixel group PG3 have, and the WDR pattern of integration times that pixels of the pixel group PG4 have may be mirror-symmetric with respect to an axis, e.g., the X-axis.

Figure 12:
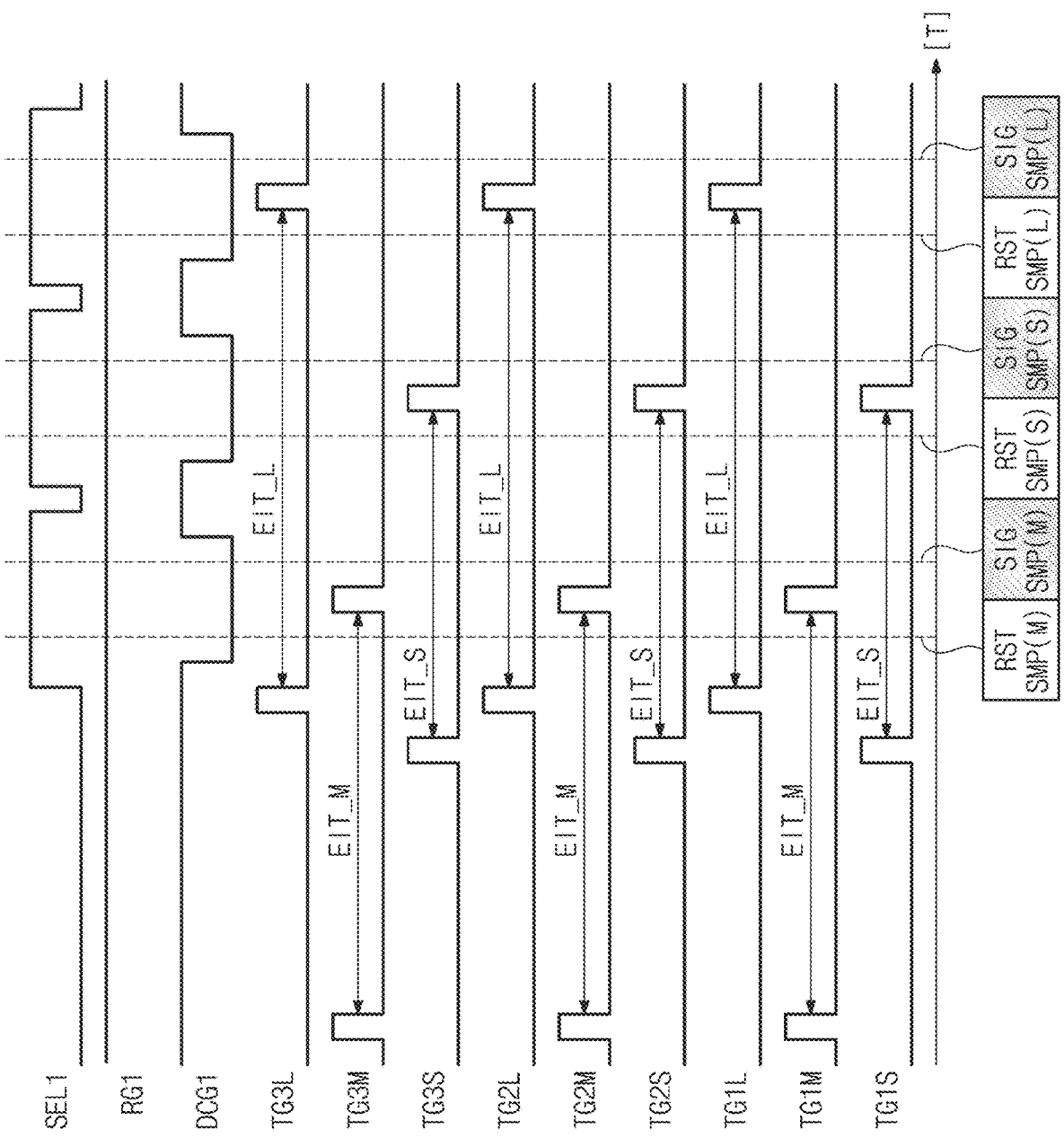
FIG. 12 is a timing diagram illustrating waveforms of signals applied to a pixel group of FIG. 11 according to at least one example embodiment.

FIG. 12 is a timing diagram illustrating waveforms of signals applied to a pixel group of FIG. 11 according to at least one example embodiment. FIG. 12 will be described with reference to FIGS. 1 to 11, and the description will be given with regard to the pixel group PG1 operating in the WDR mode, but are not limited thereto. Also, because various cases where the FWC of each of the unit pixel groups UPG1 to UPG3 of the pixel group PG1 is changed are described with reference to FIGS. 7 to 10, it is assumed that the FWC is fixed to CFD1 and that the reset signal RG1 is enabled, but are not limited thereto.

According to at least one example embodiment, during a period where the dual conversion gate signal DCG1 is enabled and the selection signal SEL1 is disabled, the transfer gate signals TG1M to TG3M may be enabled for a first period of time, and may then later be disabled during a second period of time. A period EIT_M from a time when the transfer gate signals TG1M to TG3M are disabled (e.g., the second period of time) to a time when the transfer gate signals TG1M to TG3M are again enabled (after the second period of time) may indicate a relatively middle integration time. A period EIT_S from when a time when the transfer gate signals TG1S to TG3S are disabled (e.g., the second period of time) to when the transfer gate signals TG1S to TG3S are again enabled (e.g., a third period of time) may indicate the shortest integration time. A period EIT_L from when a time when the transfer gate signals TG1L to TG3L are disabled (e.g., a second period of time) to when the transfer gate signals TG1L to TG3L are again enabled (e.g., a third period of time) may indicate the longest integration time.

After the selection signal SEL1 is enabled and the dual conversion gate signal DCG1 is disabled, and before the transfer gate signals TG1M to TG3M are enabled, the readout circuits (e.g., R1, SF1, SE1) of the pixel group PG1 may respectively sample and output reset voltage levels of the floating diffusion areas FD1 according to the middle integration time (e.g., RST SMP(M)). After the transfer gate signals TG1M to TG3M are enabled and are again disabled, the readout circuits (e.g., R1, SF1, SE1) of the pixel group PG1 may respectively sample and output signal voltage levels of the floating diffusion areas FD1 according to the middle integration time (e.g., SIG SMP(M)). After the selection signal SEL1 is enabled and the dual conversion gate signal DCG1 is disabled, and before the transfer gate signals TG1S to TG3S are enabled, the readout circuits (e.g., R1, SF1, SE1) of the pixel group PG1 may respectively sample and output reset voltage levels of the floating diffusion areas FD1 according to a short integration time (e.g., RST SMP(S)). After the transfer gate signals TG1S to TG3S are enabled and are again disabled, the readout circuits (e.g., R1, SF1, SE1) of the pixel group PG1 may respectively sample and output signal voltage levels of the floating diffusion areas FD1 according to the short integration time (e.g., SIG SMP(S)). After the selection signal SEL1 is enabled and the dual conversion gate signal DCG1 is disabled, and before the transfer gate signals TG1L to TG3L are enabled, the readout circuits (e.g., R1, SF1, SE1) of the pixel group PG1 may respectively sample and output reset voltage levels of the floating diffusion areas FD1 according to a long integration time (e.g., RST SMP(L)). After the transfer gate signals TG1L to TG3L are enabled and are again disabled, the readout circuits (e.g., R1, SF1, SE1) of the pixel group PG1 may respectively sample and output signal voltage levels of the floating diffusion areas FD1 according to the long integration time (e.g., SIG SMP(L)).

The order of outputting reset voltage levels and signal voltage levels according to different integration times is not limited to the example illustrated in FIG. 12. An analog-to-digital converter (e.g., refer to element 1300 of FIG. 19) to be described later may calculate a difference between the reset voltage levels and the signal voltage levels (perform correlated double sampling), may perform an analog or digital equalization (or averaging) operation on the reset voltage levels, and/or may perform an analog or digital equalization (or averaging) operation on the signal voltage levels, but is not limited thereto. The signals TG1S to TG3S, TG1M to TG3M, TG1L to TG3L, RG1, and/or SEL1, etc., of FIG. 12 may be applied the pixel group PG3 as well as the pixel group PG1, etc. Waveforms of the signals TG4S to TG6S, TG4M to TG6M, TG4L to TG6L, RG2, and SEL2 applied in common to the pixel groups PG2 and PG4 may be similar to the waveforms of FIG. 12, but are not limited thereto.

Figure 13:
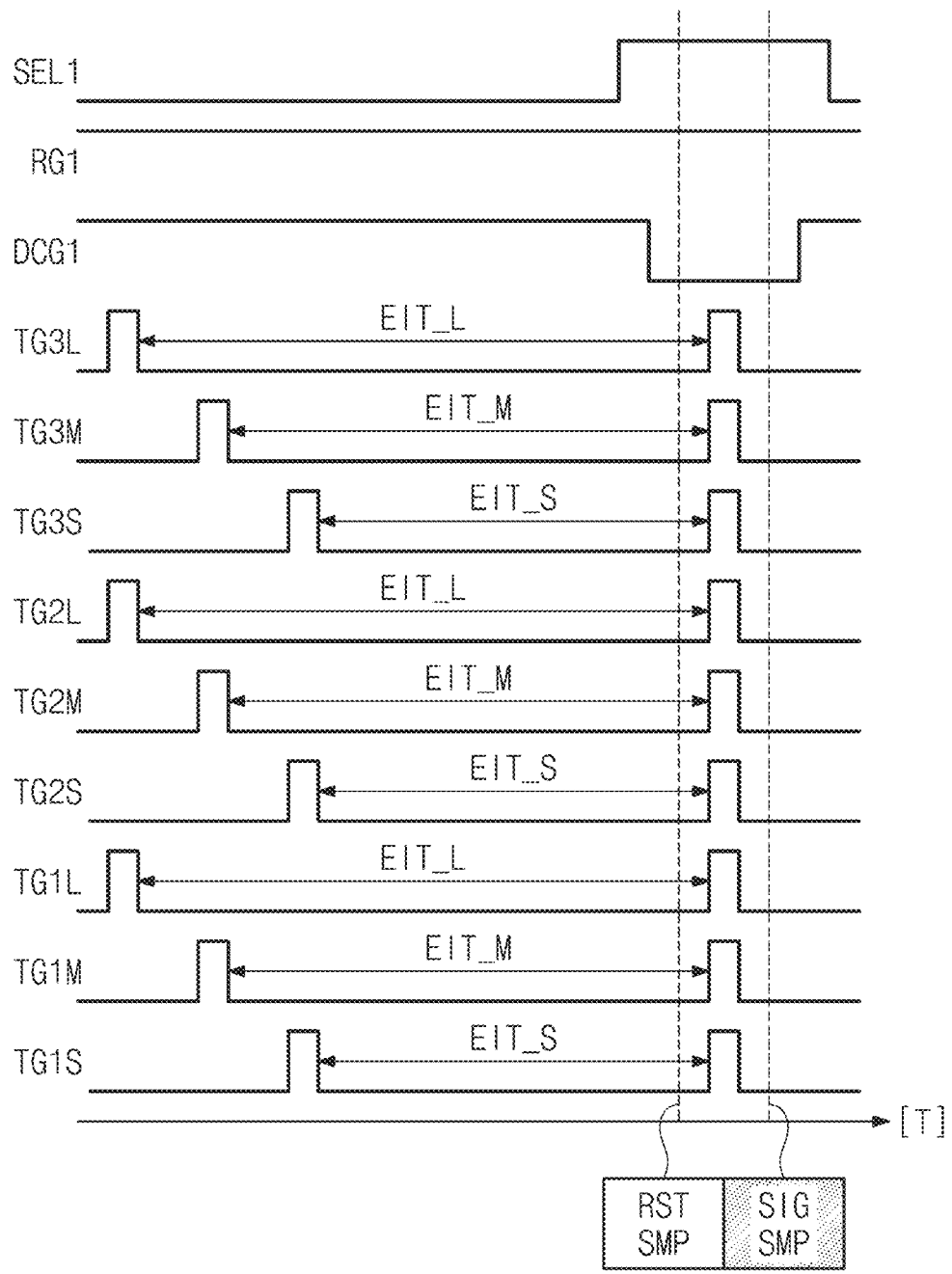
FIG. 13 is a timing diagram illustrating waveforms of signals applied to pixel groups of FIG. 11 according to at least one example embodiment.

FIG. 13 is a timing diagram illustrating waveforms of signals applied to pixel groups of FIG. 11 according to at least one example embodiment. FIG. 13 will be described with reference to FIGS. 1 to 11, the description will be focused on a difference between FIG. 12 and FIG. 13, and the description will be given with regard to the pixel group PG1 operating in a binning mode.

After the selection signal SEL1 is enabled and the dual conversion gate signal DCG1 is disabled, and before the transfer gate signals TG1S to TG3S, TG1M to TG3M, and TG1L to TG3L are simultaneously enabled, the readout circuits (e.g., R1, SF1, SE1) of the pixel group PG1 may respectively sample and output reset voltage levels of the floating diffusion areas FD1 (e.g., RST SMP). After the transfer gate signals TG1S to TG3S, TG1M to TG3M, and TG1L to TG3L are simultaneously enabled and are again simultaneously disabled, the readout circuits (e.g., R1, SF1, SE1) of the pixel group PG1 may respectively sample and output signal voltage levels of the floating diffusion areas FD1 (e.g., SIG SMP) according to a plurality of integration times corresponding to the pixels of the image sensor, e.g., a short integration time, a middle integration time, and a long integration time, etc. In the binning mode, electrons integrated by the pixels PX1 to PX3 based on and/or depending on a short integration time, a middle integration time, and/or a long integration time, etc., may be merged at the floating diffusion areas FD1 thereof.

In the WDR mode, the pixels PX1 to PX3 of the shared pixel groups SPG1a to SPG1c of the unit pixel groups UPG1 to UPG3 may be turned on at different times by the transfer gate signals TG1S to TG3S, TG1M to TG3M, and TG1L to TG3L, etc., and may be turned off at different times by the transfer gate signals TG1S to TG3S, TG1M to TG3M, and TG1L to TG3L, etc. For another example, in the binning mode, the pixels PX1 to PX3 of the shared pixel groups SPG1a to SPG1c of the unit pixel groups UPG1 to UPG3 may be turned on at the same time by the transfer gate signals TG1S to TG3S, TG1M to TG3M, and TG1L to TG3L, etc., and may be turned off at the same time by the transfer gate signals TG1S to TG3S, TG1M to TG3M, and TG1L to TG3L, etc., but the example embodiments are not limited thereto.

Figure 14:
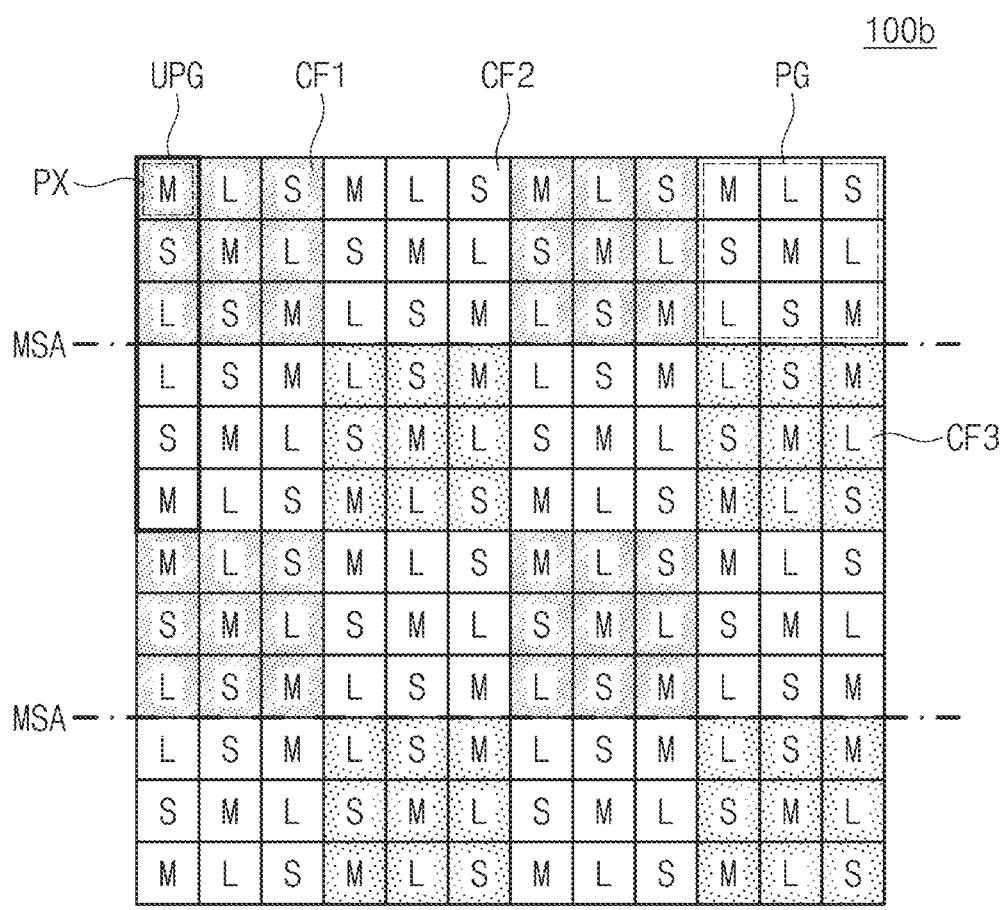
FIG. 14 illustrates a plan view of an image sensor according to at least one example embodiment of the inventive concepts.

FIG. 14 illustrates a plan view of an image sensor according to at least one example embodiment of the inventive concepts. In an image sensor 100b, the unit pixel group UPG may be repeatedly arranged along a first and second axis, e.g., the X-axis and the Y-axis, but not limited thereto. "1×6" unit pixel groups UPG may correspond to the pixel groups PG1 to PG4 of FIG. 1, but are not limited thereto, and more unit pixel groups UPG may be further included in the image sensor 100b than illustrated in FIG. 14, etc. One pixel group PG may have the WDR pattern described with reference to FIG. 11, and the WDR pattern of the one pixel group PG and the WDR pattern of another pixel group PG may be mirror-symmetric with respect to the mirror-symmetric axis MSA, but are not limited thereto. One of the color filters CF1, CF2, and CF3 may be on one pixel group PG, etc.

Figure 15:
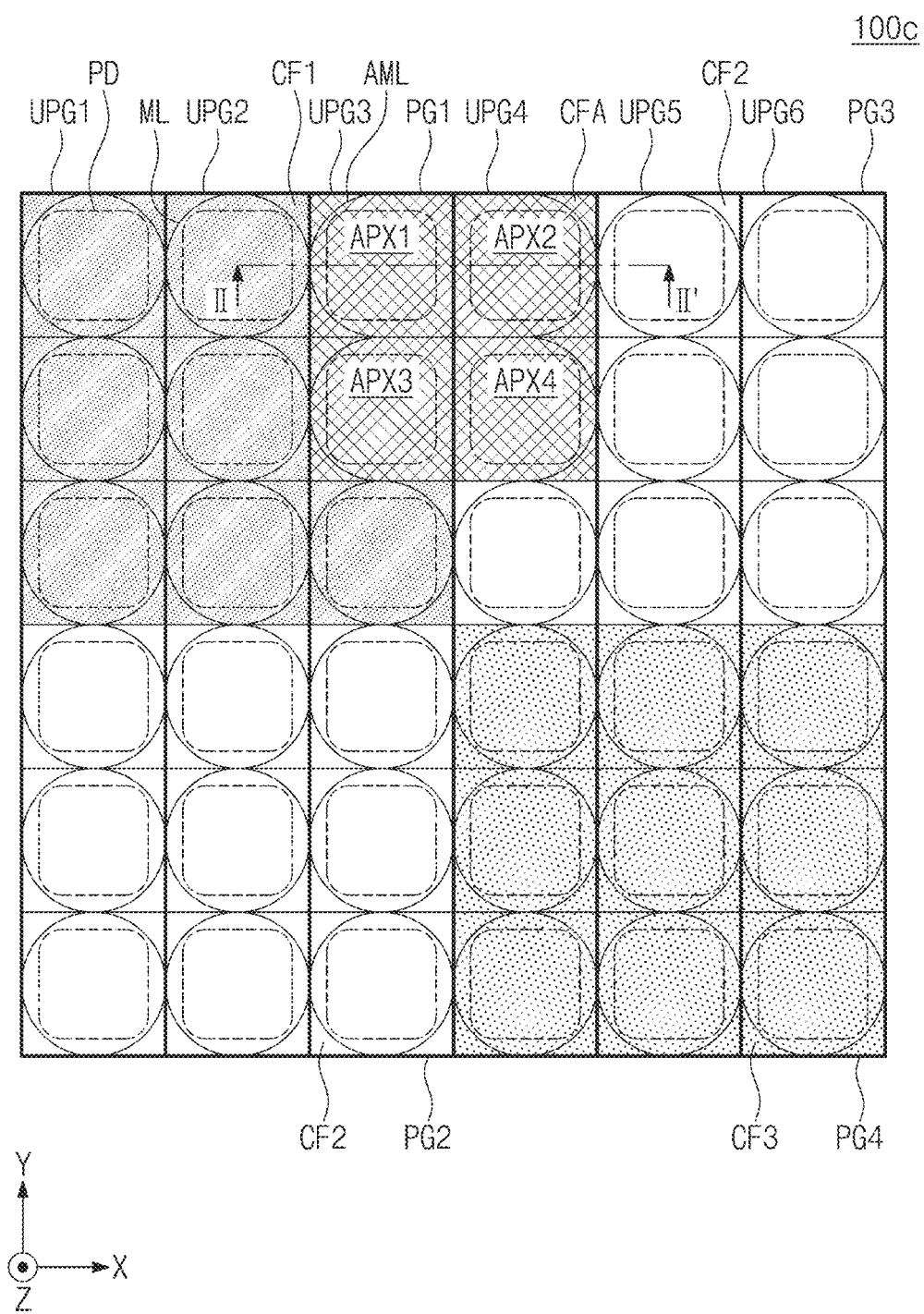
FIG. 15 illustrates a plan view of an image sensor according to at least one example embodiment of the inventive concepts.

FIG. 15 illustrates a plan view of an image sensor according to at least one example embodiment of the inventive concepts. As in the image sensor 100a, an image sensor 100c may include the unit pixel groups UPG1 to UPG6. Below, a difference between the image sensor 100a and the image sensor 100c will be mainly described.

In FIG. 15, according to at least one example embodiment, the pixels PX2 and PX3 of the unit pixel group UPG3 of FIG. 1 may be implemented with "1×2" auto focus pixels APX1 and APX3, but are not limited thereto. Also, the pixels PX2 and PX3 of the unit pixel group UPG4 of FIG. 1 may be implemented with "1×2" auto focus pixels APX2 and APX4, but are not limited thereto. Locations of the auto focus pixels APX1 to APX4 and the number of auto focus pixels APX1 to APX4 are not limited to the example illustrated in FIG. 15. Color filters CFA may be respectively located on the auto focus pixels APX1 to APX4. For example, the color filters CFA may sense a green color (i.e., may be identical to the color filters CF2), another color, or may be colorless and transparent, etc. One auto focus micro lens part AML may be located on the "2×1" auto focus pixels APX1 and APX2. One auto focus micro lens part AML may be located on the "2×1" auto focus pixels APX3 and APX4.

For example, a difference between output voltages that the "2×1" auto focus pixels APX1 and APX2 output after respectively sensing an incident light may indicate phase information. As in the above description, a difference between output voltages that the "2×1" auto focus pixels APX3 and APX4 output after respectively sensing an incident light may indicate phase information. The pieces of phase information may be used for the image sensor 100c to perform auto-focusing.

However, the example embodiments of the inventive concepts are not limited to the above numerical values. For example, "I×J" auto focus pixels ("I" and "J" being integers of 1 or more) may be distributed and included in the pixel groups PG1 and PG3. For example, the pixel group PG1 may include "I/2×J" auto focus pixels, and the pixel group PG3 may include "I/2×J" auto focus pixels, etc. For another example, the number of auto focus pixels of the pixel group PG1 and the number of auto focus pixels of the pixel group PG2 may be different. One auto focus micro lens part AML may be on the "I×J" auto focus pixels, but is not limited thereto. The auto focus micro lens part AML may be on two or more auto focus pixels, etc. "I×J" color filters may be on "I×J" auto focus pixels. "M×M–I/2×J" (or "M×N–I/2×J") color filters may be on the remaining "M×M–I/2×J" (or "M×N–I/2×J") pixels other than the "I/2×J" auto focus pixels from among the "M×M" (or "M×N") pixels, etc.

Figure 16:
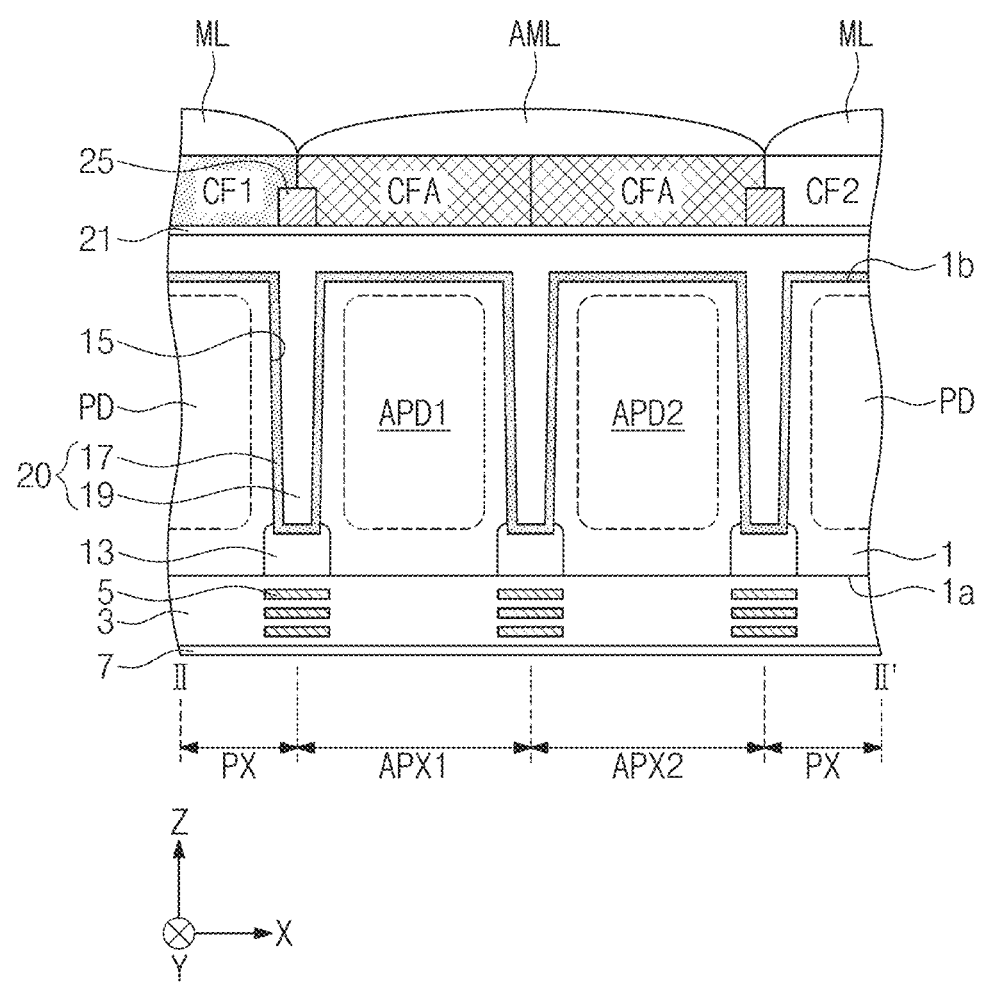
FIG. 16 is a cross-sectional view of an image sensor taken along line II-II' of FIG. 15 according to at least one example embodiment.

FIG. 16 is a cross-sectional view of an image sensor taken along line II-II' of FIG. 15 according to at least one example embodiment. Below, a difference between the cross-sectional view of FIG. 16 and the cross-sectional view of FIG. 2 will be mainly described. The light shielding pattern 25 may be located on the auxiliary insulating layer 21 between the pixels PX and APX1, but is not limited thereto. The light shielding pattern 25 may be located on the auxiliary insulating layer 21 between the pixels PX and APX2. For example, the light shielding pattern 25 may be absent on the auxiliary insulating layer 21 between the auto focus pixels APX1 and APX2, but is not limited thereto. For another example, the light shielding pattern 25 may be on the auxiliary insulating layer 21 between the auto focus pixels APX1 and APX2, etc. The auto focus micro lens part AML may be formed in the shape of an oval elongated along the X-axis in a plan view, but the example embodiments are not limited thereto and the AML may have other shapes, such as a circle, rectangle, etc. Auto focus photoelectric conversion elements APD1 and APD2 of the auto focus pixels APX1 and APX2 may be included in the substrate 1. The auto focus photoelectric conversion elements APD1 and APD2 may be substantially identical to the photoelectric conversion elements PD1, PD2, PD4, and PD5 of FIG. 2 or to a photoelectric conversion element PD of FIG. 16, but is not limited thereto.

Figure 17:
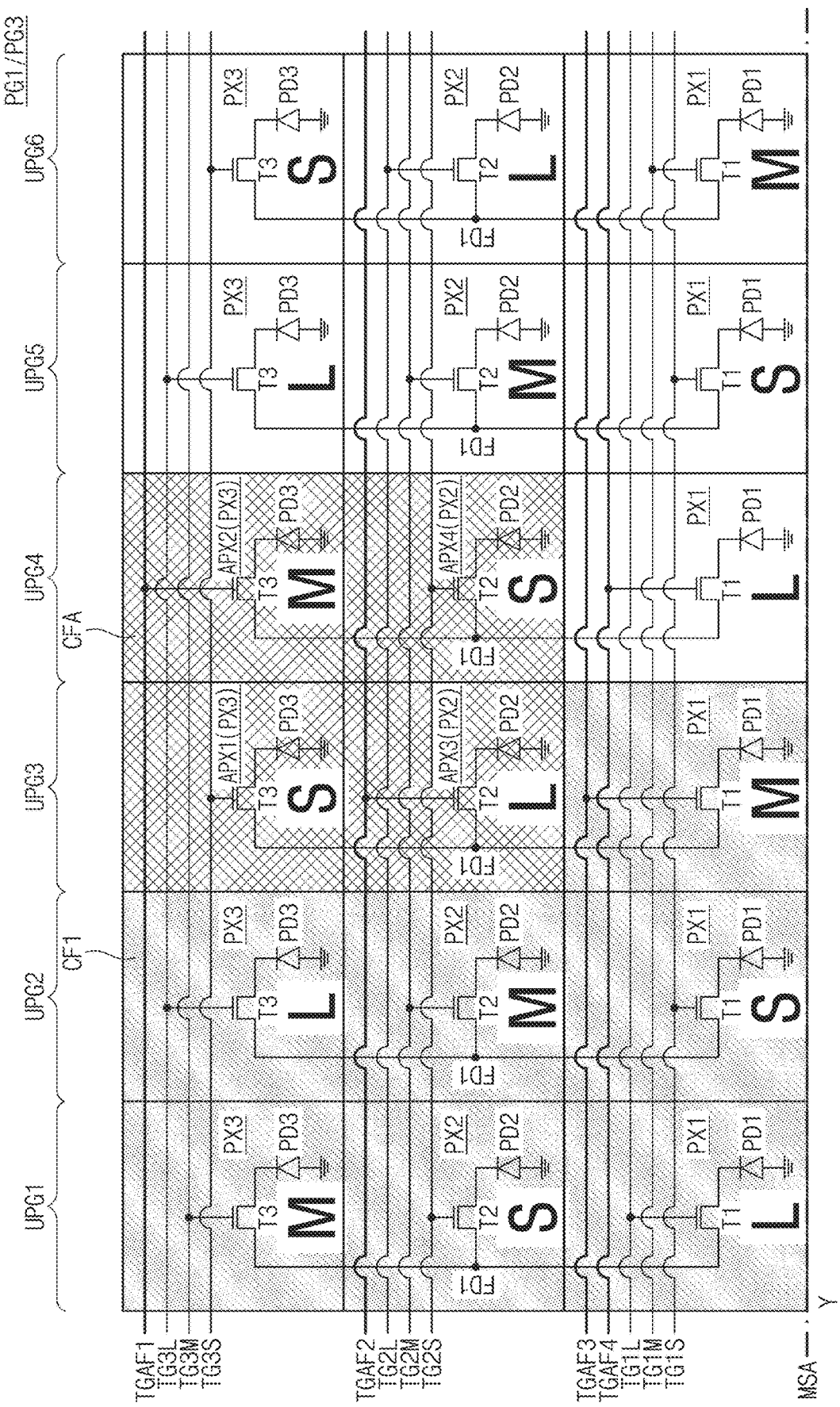
FIG. 17 illustrates some pixel groups of an image sensor of FIG. 15, according to at least one example embodiment of the inventive concepts.

FIG. 17 illustrates some pixel groups of an image sensor of FIG. 15, according to at least one example embodiment of the inventive concepts. FIG. 17 will be described with reference to FIGS. 1 to 16. The pixel groups PG1 and PG3 may include some pixels PX1 to PX3 of the pixels PX1 to PX6 of "6×1" unit pixel groups UPG1 to UPG6, but are not limited thereto. The pixels PX1 to PX3 of the "6×1" unit pixel groups UPG1 to UPG6 repeatedly arranged along the X-axis may constitute the pixel groups PG1 and PG3 of FIG. 15, but is not limited thereto. The photoelectric conversion elements PD1 to PD3 and the transfer transistors T1 to T3 of the "1×3" pixels PX1 to PX3 are only illustrated in FIG. 17. For the sake of clarity of the illustration, the remaining components R1, R2, SF1, SF2, SE1, SE2, etc. are omitted in FIG. 17. Because the image sensor 100c includes the auto focus pixels APX1 to APX4, a difference between the image sensor 100c and the image sensor 100a will be mainly described below.

According to at least one example embodiment, the signals TG1S to TG3S, TG1M to TG3M, and TG1L to TG3L, etc., to be applied to the pixel groups PG1 and PG3 of FIG. 17 may be substantially identical to the signals TG1S to TG3S, TG1M to TG3M, and TG1L to TG3L, etc., described with regard to the pixel group PG1 in FIG. 11, but are not limited thereto. Also, as in the above description, the selection signal SEL1, the reset signal RG1, and the dual conversion gate signal DCG1 described with reference to FIG. 11 may be applied to the pixel groups PG1 and PG3 of FIG. 17, but are not limited thereto.

According to at least one example embodiment, the pixels PX3 and PX2 of the unit pixel group UPG3 may be implemented with the auto focus pixels APX1 and APX3 of FIG. 15, but are not limited thereto. The pixels PX3 and PX2 of the unit pixel group UPG4 may be implemented with the auto focus pixels APX2 and APX4 of FIG. 15, but are not limited thereto. Like the transfer transistor T3 of the pixel PX3 of the unit pixel group UPG3 of FIG. 11, the transfer transistor T3 of the auto focus pixel APX1 may receive the transfer gate signal TG3S having the shortest integration time. In the case where the pixel PX3 of the unit pixel group UPG4 is not the auto focus pixel APX2, the transfer transistor T3 of the pixel PX3 of the unit pixel group UPG4 may receive the transfer gate signal TG3M having the middle integration time. However, because the pixel PX3 of the unit pixel group UPG4 is the auto focus pixel APX2, the transfer transistor T3 of the pixel PX3 of the unit pixel group UPG4 may receive an auto focus transfer gate signal TGAF1, not the transfer gate signal TG3M. In the case where the pixel PX2 of the unit pixel group UPG3 is not the auto focus pixel APX3, the transfer transistor T2 of the pixel PX2 of the unit pixel group UPG3 may receive the transfer gate signal TG2L having the longest integration time. However, because the pixel PX2 of the unit pixel group UPG3 is the auto focus pixel APX3, the transfer transistor T2 of the pixel PX2 of the unit pixel group UPG3 may receive an auto focus transfer gate signal TGAF2, not the transfer gate signal TG2L. The transfer transistor T2 of the auto focus pixel APX4 may receive the transfer gate signal TG2S having the shortest integration time. For example, the transfer transistors T2 and T3 of the auto focus pixels APX1 to APX4 may respectively receive the transfer gate signals TG3S, TGAF1, TGAF2, and TG2S each having the shortest integration time, such that the photoelectric conversion elements PD2 and PD3 are not saturated. For another example, the transfer transistors T2 and T3 of the auto focus pixels APX1 to APX4 may receive transfer gate signals each having the middle integration time or the long integration time, e.g., the non-auto focus transfer gate signals. In any case, the transfer transistors T2 and T3 of the auto focus pixels APX1 to APX4 may receive transfer gate signals having the same integration time, but not limited thereto.

Referring to FIG. 11, according to at least one example embodiment, the transfer transistor T1 of the pixel PX1 of the unit pixel group UPG3 receives the transfer gate signal TG1M, and the transfer transistor T1 of the pixel PX1 of the unit pixel group UPG4 receives the transfer gate signal TG1L. However, referring to FIG. 17, the transfer transistor T1 of the pixel PX1 of the unit pixel group UPG3 may receive not the transfer gate signals TG1S to TG1L, but instead receives the auto focus transfer gate signal TGAF3, and the transfer transistor T1 of the pixel PX1 of the unit pixel group UPG4 does not receive the transfer gate signals TG1S to TG1L, but instead receives the auto focus transfer gate signal TGAF4.

According to at least one example embodiment, the pixels PX1, APX3(PX2), and APX1(PX3) of the unit pixel group UPG3 share the floating diffusion area FD1. Accordingly, in the case where the unit pixel group UPG3 operates in the auto focus mode and the binning mode, the auto focus transfer gate signal TGAF3 that has a disabled state while the transfer gate signals TG1S to TG3S, TG1M to TG3M, TG1L to TG3L, TGAF1, and TGAF2 are simultaneously enabled, may have to be applied to the transfer transistor T1 of the pixel PX1 of the unit pixel group UPG3. As in the above description, the pixels PX1, APX4(PX2), and APX2 (PX3) of the unit pixel group UPG4 may share the floating diffusion area FD1. Accordingly, in the case where the unit pixel group UPG4 operates in the auto focus mode and the binning mode, the auto focus transfer gate signal TGAF4 that has a disabled state while the transfer gate signals TG1S to TG3S, TG1M to TG3M, TG1L to TG3L, TGAF1, and TGAF2 are simultaneously enabled, may have to be applied to the transfer transistor T1 of the pixel PX1 of the unit pixel group UPG4, but are not limited thereto.

Compared to the case of FIG. 11, due to the auto focus pixels APX1 to APX4, the auto focus transfer gate signals TGAF1, TGAF2, TGAF3, and TGAF4 passing through the pixel groups PG1 and PG3 may further exist, and lines passing through the pixels PX1 to PX3 along the X-axis may indicate auto focus transfer gate lines through which the auto focus transfer gate signals TGAF1, TGAF2, TGAF3, and TGAF4 are transferred, but the example embodiments are not limited thereto.

Figure 18:
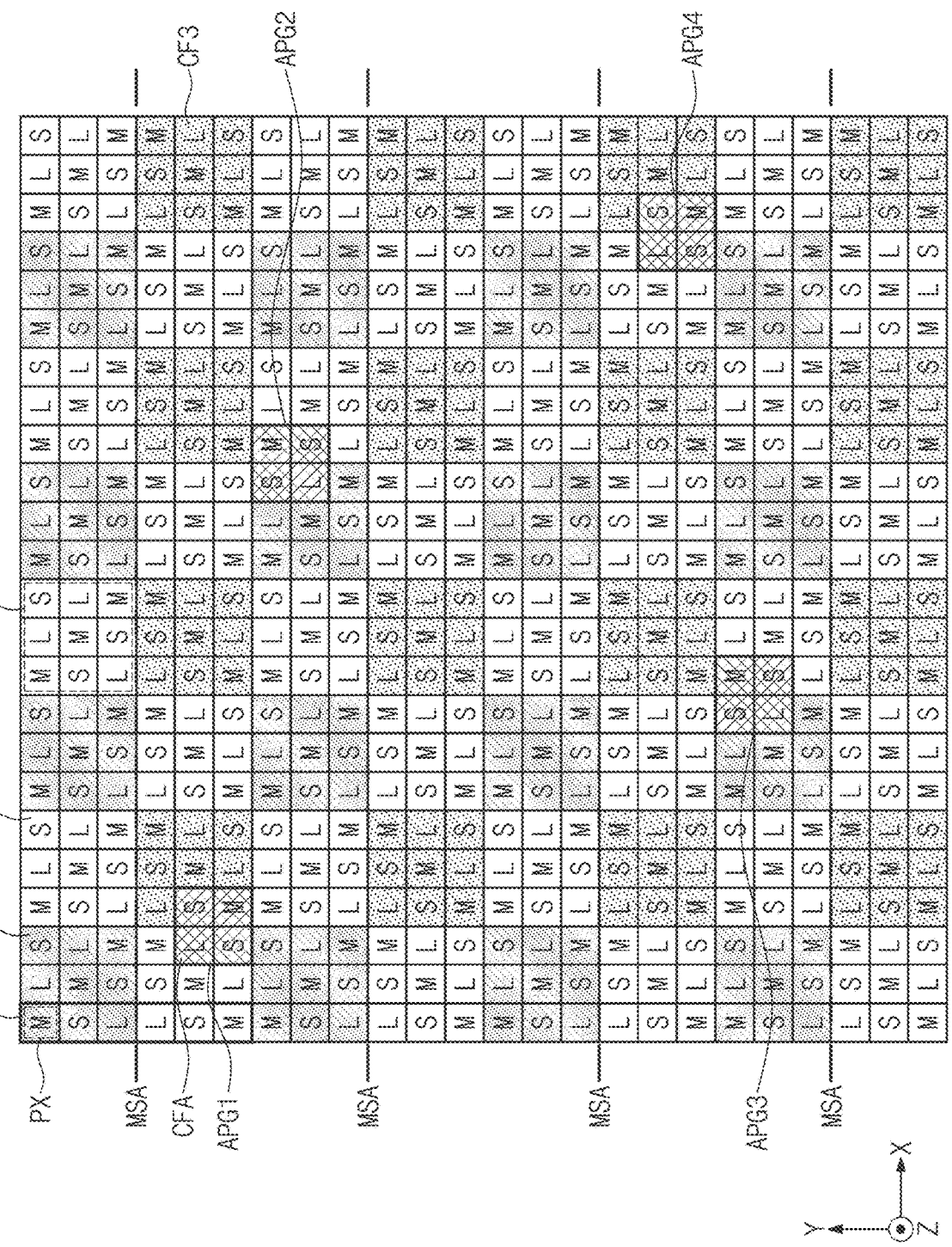
FIG. 18 illustrates a plan view of an image sensor according to at least one example embodiment of the inventive concepts.

FIG. 18 illustrates a plan view of an image sensor according to at least one example embodiment of the inventive concepts. In an image sensor 100d, the unit pixel group UPG may be repeatedly arranged along a first and second axis, e.g., the X-axis and the Y-axis, etc. The unit pixel groups UPG repeatedly arranged may constitute a plurality of pixel groups PG. One of the color filters CF1, CF2, and CF3 may be on one pixel group PG, but the example embodiments are not limited thereto.

Some pixels PX of the plurality of pixel groups PG may be auto focus pixels. The auto focus pixel groups APG1 to APG4 including auto focus pixels may be arranged as illustrated in FIG. 18. The number of auto focus pixels in the auto focus pixel groups APG1 to APG4 may be "I×J," and is not limited to the example illustrated in FIG. 18. Also, locations of the auto focus pixel groups APG1 to APG4 are not limited to the example illustrated in FIG. 18. The auto focus pixel groups APG1 to APG4 may form an auto focus pattern.

Figure 19:
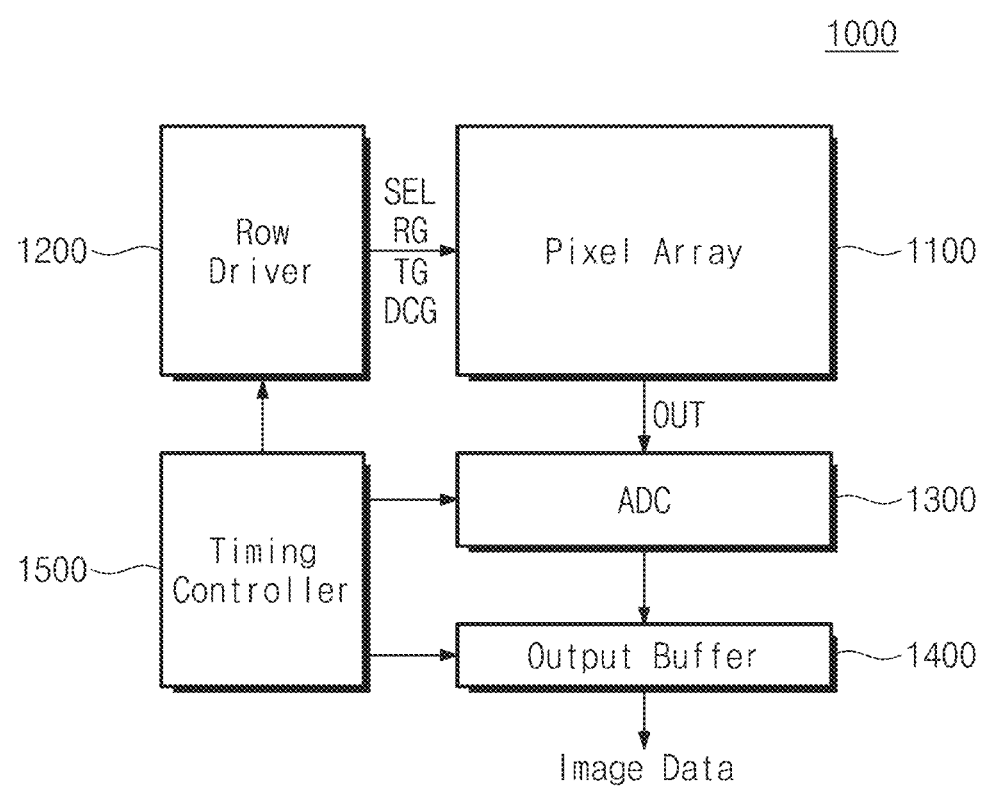
FIG. 19 illustrates a block diagram of an image sensor according to at least one example embodiment of the inventive concepts.

FIG. 19 illustrates a block diagram of an image sensor according to at least one example embodiment of the inventive concepts. An image sensor 1000 may include a pixel array 1100, a row decoder 1200, an analog-to-digital converter (ADC) 1300, an output buffer 1400, and/or a timing controller 1500, etc. The pixel array 1100 may include pixels arranged along the X-axis and the Y-axis. The pixels of the pixel array 1100 may correspond to pixels illustrated in the plan views of the image sensors 100a to 100d described with reference to FIGS. 1 to 18. The pixel array 1100 may be controlled by sensor driving signals, which are provided from the row decoder 1200, such as a selection signal SEL, a reset signal RG, a transfer gate signal TG, and/or a dual conversion gate signal DCG, etc. The selection signal SEL may include the selection signals SEL1 and SEL2, the reset signal RG may include the reset signals RG1 and RG2, the transfer gate signal TG may include the transfer gate signals TG1S to TG6S, TG1M to TG6M, TG1L to TG6L, and TGAF1 to TGAF4, and the dual conversion gate signal DCG may include the dual conversion gate signals DCG1 and DCG2, but the example embodiments are not limited thereto. A plurality of electrical signals corresponding to incident light being sensed by respective pixels in response to the sensor driving signals, may be transferred to the analog-to-digital converter 1300 as output signals OUT. The row decoder 1200 may select one of rows of the pixel array 1100 under control of the timing controller 1500. The row decoder 1200 generates the selection signal SEL for the purpose of selecting one or more of the plurality of rows. The row decoder 1200 may sequentially enable (and/or activate) the reset signal RG and the transfer gate signal TG associated with pixels corresponding to the selected row. As such, output signals for each illuminance generated from shared pixel groups (e.g., refer to SPG, SPG1a to SPG1c, or SGP2a to SGP2c, etc.) of the selected row may be sequentially transferred to the analog-to-digital converter 1300. The analog-to-digital converter 1300 converts the output signals transferred from the pixel array 1100 into a digital signal under control of the timing controller 1500. For example, the analog-to-digital converter 1300 may perform an analog or digital equalization (or averaging) operation on the output signals, but is not limited thereto. For example, the analog-to-digital converter 1300 may perform a binning operation, etc. The analog-to-digital converter 1300 may further include a correlated double sampler (CDS) for performing correlated double sampling. The output buffer 1400 stores and/or outputs image data provided from the analog-to-digital converter 1300 in units of a column. Under control of the timing controller 1500, the output buffer 1400 may store image data output from the analog-to-digital converter 1300 and may output the stored image data. The timing controller 1500 controls the pixel array 1100, the row decoder 1200, the analog-to-digital converter 1300, the output buffer 1400, etc. The timing controller 1500 may generate and transfer control signals, such as a clock signal and/or a timing control signal, etc., to the pixel array 1100, the row decoder 1200, the analog-to-digital converter 1300, the output buffer 1400, etc. The timing controller 1500 may include a logic control circuit, a phase locked loop circuit, a timing controller circuit, a communication interface circuit, etc.

Figure 20:
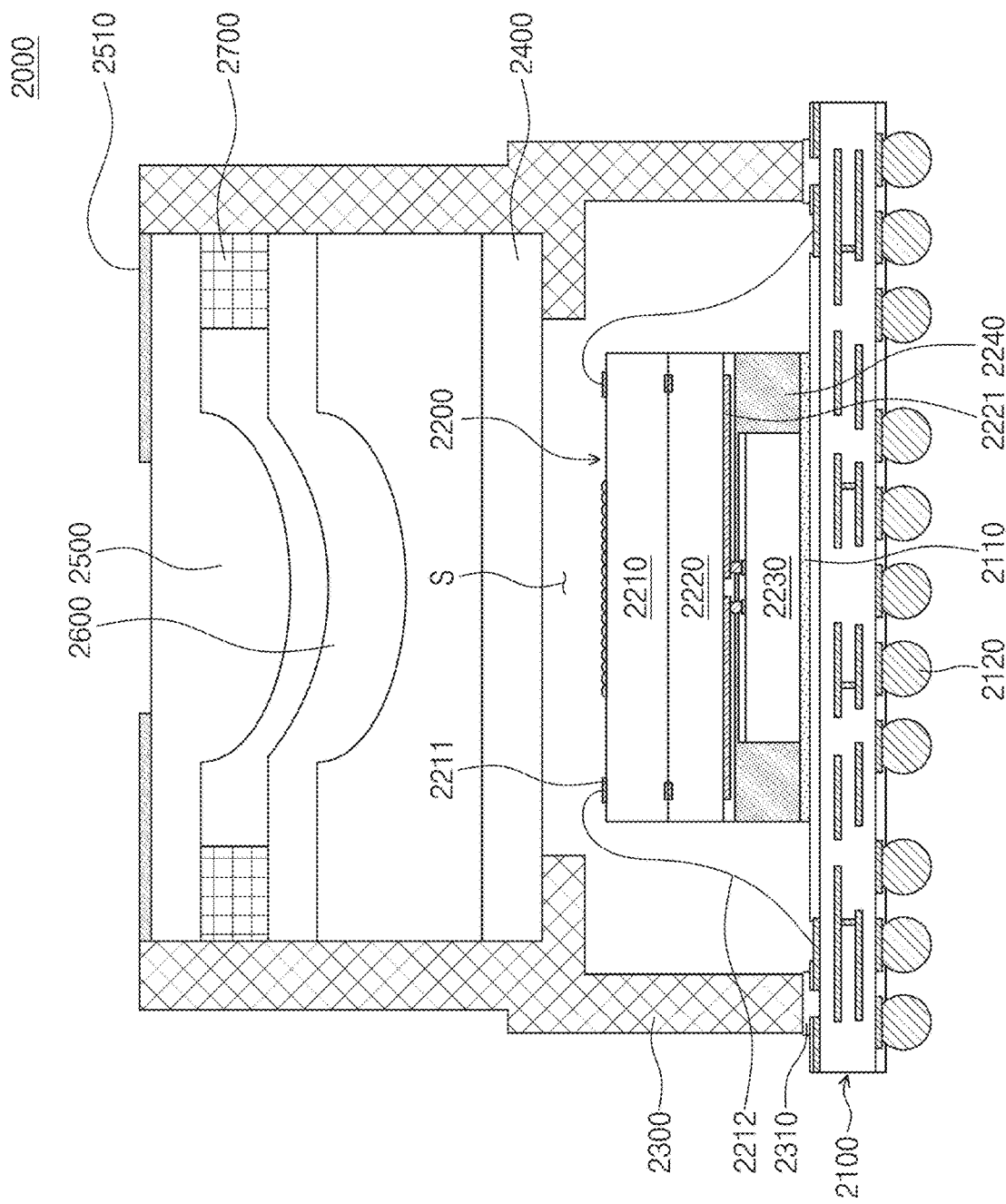
FIG. 20 illustrates a cross-sectional view of a semiconductor package module according to at least one example embodiment of the inventive concepts.

FIG. 20 illustrates a cross-sectional view of a semiconductor package module according to at least one example embodiment of the inventive concepts. In a semiconductor package module 2000, a semiconductor package 2200 may be attached to a package substrate 2100 by an adhesive layer 2110. The semiconductor package 2200 may include a semiconductor chip 2210, a semiconductor chip 2220 mounted under the semiconductor chip 2210, and/or a semiconductor chip 2230 mounted under the semiconductor chip 2220, etc., but is not limited thereto. The semiconductor chips 2210, 2220, and 2230 may have different functions, or may have the same or similar functions. The semiconductor chip 2210 and the semiconductor chip 2220 may have the same width, but is not limited thereto. Side walls of the semiconductor chip 2210 and the semiconductor chip 2220 may be vertically aligned, etc. The semiconductor chip 2210 and the semiconductor chip 2220 may contact each other, or not. A redistribution pattern 2221 may be under the semiconductor chip 2220, etc. The semiconductor chip 2210 may be an image sensor chip including at least one of the image sensors 100a to 100d described with reference to FIGS. 1 to 19, but is not limited thereto. The semiconductor chip 2220 may be a logic chip for driving the semiconductor chip 2210. A width of the semiconductor chip 2230 may be smaller than a width of the semiconductor chip 2220. A side wall of the semiconductor chip 2230 may not be vertically aligned with a side wall of the semiconductor chip 2220. For example, the semiconductor chip 2230 may be a memory chip for storing data generated from the semiconductor chip 2210 and/or the semiconductor chip 2220, etc. A side wall of the semiconductor chip 2230 may be covered with a molding layer 2240. The logic chip may be bonded to the image sensor chip, and the memory chip may be bonded to the logic chip in a flip-chip bonding scheme, but the example embodiments are not limited thereto. This may provide a fast readout function compared to the case where the memory chip is distant from the image sensor chip. In the case where the memory chip is a DRAM, locations and sizes of input/output terminals may be standardized to reduce costs through the mass production, but the example embodiments are not limited thereto. In this case, the sizes of the logic chip and the DRAM chip may be different, and locations of the input/output terminals may be misaligned. The semiconductor chip 2220 capable of being a logic chip may include the redistribution pattern 2221, thus increasing the freedom of wires for connecting the semiconductor chip 2220 and the semiconductor chip 2230, but are not limited thereto. An upper conductive pad 2211 of the semiconductor chip 2210 and the package substrate 2100 may be connected with a wire 2212. A holder 2300 may be on the package substrate 2100. The holder 2300 may be spaced from the semiconductor package 2200. The holder 2300 may be attached to the package substrate 2100 by using an adhesive layer 2310. The holder 2300 may have the shape of a closed curve in a plan view, but is not limited thereto. The holder 2300 may be adjacent to an edge of the semiconductor package 2200, and may have a hollow structure. The holder 2300 may be formed of a polymer material such as polyamide, etc. A transparent substrate 2400 may be on the holder 2300. The transparent substrate 2400 may be formed of transparent glass, plastic, etc. The transparent substrate 2400 may be spaced from the semiconductor package 2200 and may provide an empty space "S". A solder bump 2120 may be under (or on a lower surface of) the package substrate 2100. A plurality of lenses 2500 and 2600, a spacer 2700, and a light shielding layer 2510 may be on the transparent substrate 2400. For example, a field of view (FOV) of the semiconductor package module 2000 may be greater than 20° and may be smaller than 100°, but the example embodiments are not limited thereto.

Figure 21:
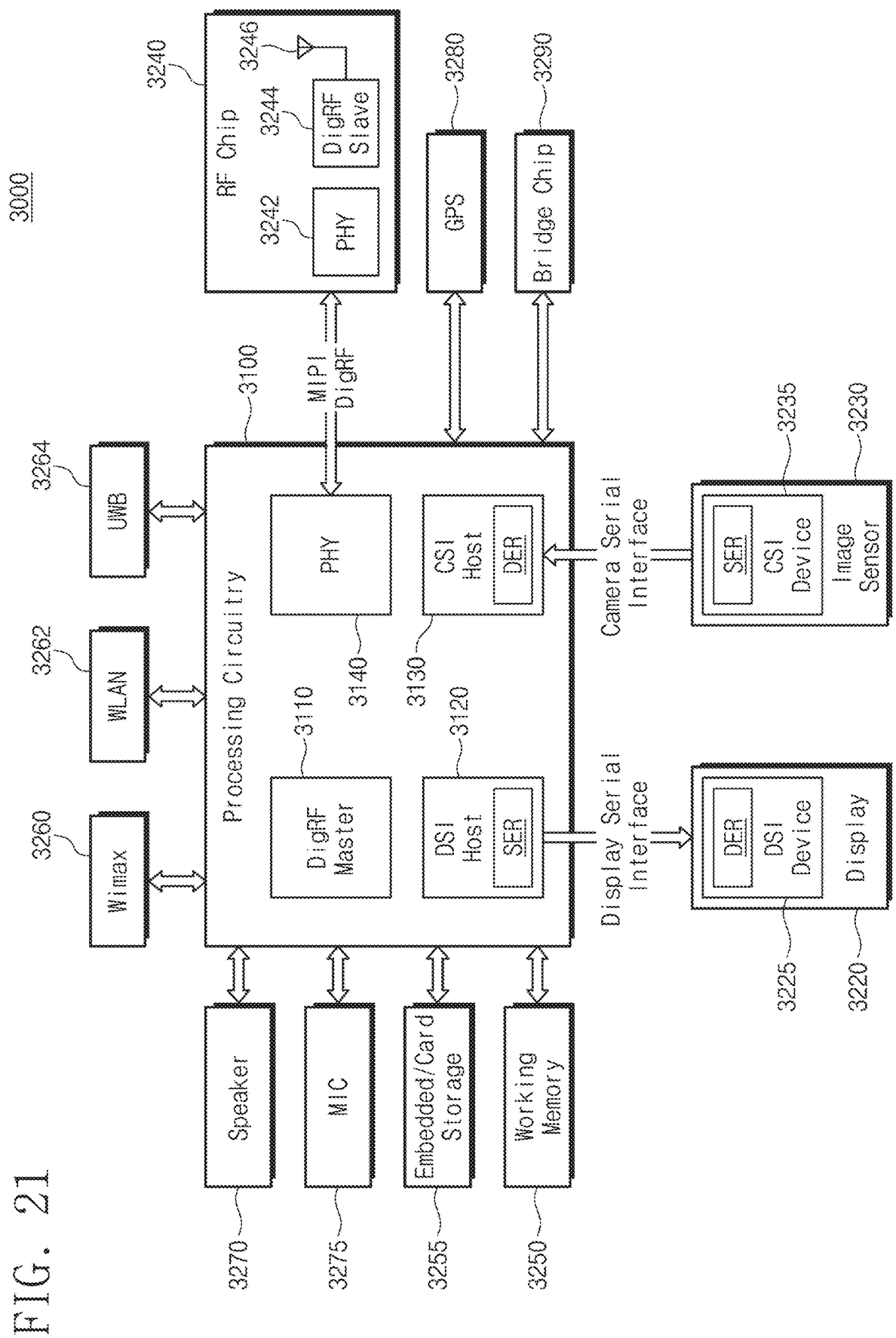
FIG. 21 illustrates a block diagram of an electronic device to which an image sensor according to at least one example embodiment of the inventive concepts is applied.

FIG. 21 illustrates a block diagram of an example electronic device to which an image sensor according to at least one example embodiment of the inventive concepts is applied. An electronic device 3000 may be referred to as a "computing system", a "memory system", an "electronic system", and/or a "communication system", etc., but the example embodiments are not limited thereto. For example, the electronic device 3000 may be a desktop computer, a laptop computer, a tablet computer, a mobile device, a smartphone, a smart device, a personal digital assistant (PDA), a portable multimedia player (PMP), a wearable device, a video game console, a workstation, a server, a data processing device capable of using or supporting an interface protocol proposed by the mobile industry processor interface (MIPI) alliance, home appliances, a black box, a drone, a virtual reality and/or augmented reality device, an Internet of Things (IoT) device, etc.

The electronic device 3000 may include a processing circuitry 3100, a display 3220, and/or an image sensor 3230, but is not limited thereto. The processing circuitry 3100 may include hardware such as logic circuits; a hardware/software combination such as at least one processor core executing software and/or executing any instruction set; or a combination thereof. For example, the processing circuitry more specifically may include, but is not limited to, a central processing unit (CPU), an arithmetic logic unit (ALU), a digital signal processor (DSP), a graphics processing unit (GPU), a communication process (CP), a microcomputer, a field programmable gate array (FPGA), a System-on-Chip (SoC), a programmable logic unit, a microprocessor, application-specific integrated circuit (ASIC), etc. Additionally, the processing circuitry 3100 may include a DigRF master 3110, a display serial interface (DSI) host 3120, a camera serial interface (CSI) host 3130, and/or a physical layer 3140, etc., but is not limited thereto. The DSI host 3120 may communicate with a DSI device 3225 of the display 3220 through the DSI. For example, a serializer SER may be implemented in the DSI host 3120, and a deserializer DES may be implemented in the DSI device 3225, but is not limited thereto. The CSI host 3130 may communicate with a CSI device 3235 of the image sensor 3230 through a CSI. For example, a deserializer DES may be implemented in the CSI host 3130, and a serializer SER may be implemented in the CSI device 3235, but is not limited thereto. The image sensor 3230 may be one of the semiconductor package module 2000 and the image sensors 100a to 100d and 1000 described with reference to FIGS. 1 to 20.

The electronic device 3000 may further include a radio frequency (RF) chip 3240 that communicates with the processing circuitry 3100. According to other example embodiments, the processing circuitry 3100 may include the RF chip 3240, etc. The RF chip 3240 may include a physical layer 3242, a DigRF slave 3244, and/or an antenna 3246, etc. For example, the physical layer 3242 and the physical layer 3140 may exchange data with each other through a DigRF interface proposed by the MIPI alliance, but are not limited thereto. The electronic device 3000 may further include a working memory 3250 and/or an embedded/card storage device 3255, etc. The working memory 3250 and the embedded/card storage 3255 may store and output data associated with the processing circuitry 3100. The embedded storage device 3255 may be embedded in the electronic device 3000, and the card storage device 3255 that is a removable device may be mounted on the electronic device 3000. The electronic device 3000 may communicate with an external device/system through a communication module, such as a worldwide interoperability for microwave access (WiMAX) 3260, a wireless local area network (WLAN) 3262, or an ultra-wideband (UWB) 3264, etc. The electronic device 3000 may further include a speaker 3270, a microphone 3275, a global positioning system (GPS) device 3280, and/or a bridge chip 3290, etc.

According to at least one example embodiment of the inventive concepts, a first set of pixels and a second set of pixels of a unit pixel group may be repeatedly arranged on an image sensor, and may be mirror-symmetric with each other. Accordingly, as a unit pixel group is repeatedly arranged, a pattern for implementing pixels in a unit pixel group may be regularly implemented, and characteristic differences of the pixels due to a difference between the layouts of the pixels may be reduced, removed and/or excluded.

While the inventive concepts has been described with reference to example embodiments thereof, it will be apparent to those of ordinary skill in the art that various changes and modifications may be made thereto without departing from the spirit and scope of the example embodiments of the inventive concepts as set forth in the following claims.

What is claimed is:
1. An image sensor comprising:
a plurality of first pixels arranged in a M×N grid on a substrate along a first axis and a second axis, M and N being integers of 1 or more, the plurality of first pixels connected to a first output line extending along the second axis, and a subset of the plurality of first pixels further being a plurality of first auto focus pixels;
a plurality of second pixels arranged in the M×N grid on the substrate along the first axis and the second axis, the plurality of second pixels being mirror-symmetric to the plurality of first pixels with respect to the first axis, and the plurality of second pixels connected to the first output line;

a plurality of first color filters arranged in the M×N grid on a portion of the plurality of first pixels, each of the plurality of first color filters having a first color;

a plurality of second color filters arranged in the M×N grid on the plurality of second pixels, each of the plurality of second color filters having a second color; and a plurality of first auto focus color filters arranged on the plurality of first auto focus pixels, each of the plurality of first auto focus color filters having a color different than the first color.

2. The image sensor of claim 1, wherein
the plurality of first pixels include:
   a plurality of first photoelectric conversion elements arranged in the M×N grid;
   a plurality of first transfer transistors respectively arranged in the M×N grid, the plurality of first transfer transistors connected with the plurality of first photoelectric conversion elements, respectively; and
   a first floating diffusion area connected with at least one of the plurality of first transfer transistors;
   a first reset transistor configured to reset the first floating diffusion area;
   a first source follower transistor connected to the first floating diffusion area; and
   a first selection transistor connected with the first source follower transistor, and
the plurality of second pixels include:
   a plurality of second photoelectric conversion elements arranged in the M×N grid;
   a plurality of second transfer transistors arranged in the M×N grid and respectively connected with the plurality of second photoelectric conversion elements, respectively;
   a second floating diffusion area connected with at least one of the plurality of second transfer transistors;
   a second reset transistor configured to reset the second floating diffusion area;
   a second source follower transistor connected with the second floating diffusion area; and
   a second selection transistor connected with the second source follower transistor.

3. The image sensor of claim 2, further comprising:
a first gate layout pattern corresponding to the plurality of first pixels; and
a second gate layout pattern corresponding to the plurality of second pixels,
wherein the first gate layout pattern and the second gate layout pattern are mirror-symmetric with respect to the first axis;
wherein the first gate layout pattern includes a plurality of first gate terminals connected to the plurality of first transfer transistors, the first reset transistor, the first source follower transistor, and the first selection transistor, and
wherein the second gate layout pattern includes a plurality of second gate terminals connected to the plurality of second transfer transistors, the second reset transistor, the second source follower transistor, and the second selection transistor.

4. The image sensor of claim 2, wherein
the plurality of first pixels further include,
   a first dual conversion transistor connected between the first floating diffusion area and the first reset transistor, and
   a third floating diffusion area electrically connected with the first floating diffusion area through the first dual conversion transistor; and
the plurality of second pixels further include,
   a second dual conversion transistor connected between the second floating diffusion area and the second reset transistor, and
   a fourth floating diffusion area electrically connected with the second floating diffusion area through the second dual conversion transistor.

5. The image sensor of claim 4, wherein
the plurality of first pixels and the plurality of second pixels are configured to share a metal wire electrically connecting the third floating diffusion area and the fourth floating diffusion area.

6. The image sensor of claim 2, wherein
transfer transistors, which are mirror-symmetric with respect to the first axis, from among the plurality of first transfer transistors and the plurality of second transfer transistors are configured to receive a plurality of first transfer gate signals,
wherein other transfer transistors, which are mirror-symmetric with respect to the first axis, from among the plurality of first transfer transistors and the plurality of second transfer transistors are configured to receive a plurality of second transfer gate signals, and
a first integration time corresponding to the plurality of first transfer gate signals is different from a second integration time corresponding to plurality of second transfer gate signals.

7. The image sensor of claim 1, wherein
the N is equal to the M, and the M is 2 or greater; and
the plurality of first pixels further include,
   a plurality of first photoelectric conversion elements arranged in the M×N grid, a plurality of first transfer transistors arranged in the M×N grid and respectively connected with the plurality of first photoelectric conversion elements, and
M first floating diffusion areas, each of the M first floating diffusion areas each connected to at least a first subset of the plurality of first transfer transistors.

8. The image sensor of claim 7, further comprising:
a plurality of third pixels arranged in the M×N grid in the substrate along the first axis and the second axis;
a plurality of fourth pixels arranged in the M×N grid in the substrate along the first axis and the second axis, and adjacent to the plurality of third pixels along the first axis;
a plurality of third color filters respectively on the plurality of third pixels; and
a plurality of fourth color filters respectively on the plurality of fourth pixels, and
wherein
the plurality of third pixels includes a second auto focus pixel,
the plurality of fourth pixels includes a third auto focus pixel,
a first one of the plurality of third color filters is on the second auto focus pixel of the plurality of third pixels,
a second one of the plurality of fourth color filters is on the third auto focus pixel of the plurality of fourth pixels, and the first one of the plurality of third color filters and the second one of the plurality of fourth color filter have the same color.

9. The image sensor of claim 8, wherein
the plurality of first pixels, the plurality of third pixels, and the plurality of fourth pixels are in the substrate along the first axis;
the second auto focus pixel includes a second photoelectric conversion element and a second transfer transistor connected with the second photoelectric conversion element;
the third auto focus pixel includes a third photoelectric conversion element and a third transfer transistor connected with the third photoelectric conversion element;
one of the second and third transfer transistors is configured to receive one of a plurality of first transfer gate signals respectively applied to the plurality of first transfer transistors; and
the other of the second and third transfer transistors is configured to receive a second transfer gate signal different from the plurality of first transfer gate signals.

10. The image sensor of claim 9, wherein each of the plurality of first transfer gate signals is switched based on an integration time corresponding to at least one of the integration times of the plurality of first pixels, and
the one of the plurality of first transfer gate signals and the second transfer gate signal corresponds to the shortest integration time of the integration times of the plurality of first pixels.

11. The image sensor of claim 9, wherein
a second individual pixel from the plurality of third pixels includes a fourth photoelectric conversion element and a fourth transfer transistor connected with the fourth photoelectric conversion element;
a second individual pixel from the plurality of fourth pixels includes a fifth photoelectric conversion element and a fifth transfer transistor connected with the fifth photoelectric conversion element;
the fourth transfer transistor receives a third transfer gate signal different from the plurality of first transfer gate signals; and
the fifth transfer transistor receives a fourth transfer gate signal different from the plurality of first transfer gate signals.

12. The image sensor of claim 8, further comprising:
a first micro lens part located on the one of the plurality of third color filters and the one of the plurality of fourth color filters, the first micro lens part configured to cover both the second auto focus pixel and the third auto focus pixel; and
a plurality of second micro lens parts each located on one of the remaining color filters of the plurality of third color filters and one of the remaining color filters of the plurality of fourth color filters.

13. An image sensor including a plurality of unit pixel groups repeatedly arranged along a first axis and a second axis, each of the plurality of unit pixel groups including:
a plurality of first shared pixels arranged in a 1×N grid, N being an integer of 2 or more, along the second axis, and connected with a first output line extending along the second axis, and a subset of the Plurality of first shared pixels further being a plurality of first auto focus pixels;
a plurality of first color filters arranged on a portion of the plurality of first shared pixels, each of the plurality of first color filters having a first color;
a plurality of first auto focus color filters arranged on the plurality of first auto focus pixels, each of the plurality of first auto focus color filters having a color different than the first color; and
a plurality of second shared pixels arranged in a 1×N grid along the second axis, and connected with the first output line,
wherein the plurality of second shared pixels are mirror-symmetric to the plurality of first shared pixels with respect to the first axis.

14. The image sensor of claim 13, wherein
the plurality of first shared pixels include,
a plurality of first photoelectric conversion elements,
a plurality of first transfer transistors respectively connected with the plurality of first photoelectric conversion elements,
a first floating diffusion area connected with the plurality of first transfer transistors,
a first reset transistor configured to reset the first floating diffusion area,
a first source follower transistor connected with the first floating diffusion area, and
a first selection transistor connected with the first source follower transistor; and
the plurality of second shared pixels include,
a plurality of second photoelectric conversion elements,
a plurality of second transfer transistors respectively connected with the a plurality of second photoelectric conversion elements,
a second floating diffusion area connected with the plurality of second transfer transistors,
a second reset transistor configured to reset the second floating diffusion area,
a second source follower transistor connected with the second floating diffusion area, and
a second selection transistor connected with the second source follower transistor.

15. The image sensor of claim 14, wherein
the plurality of first transfer transistors and the plurality of second transfer transistors configured to receive a plurality of transfer gate signals through 2N transfer gate lines; and
each of the plurality of transfer gate signals is switched on based on an integration time of N integration times.

16. The image sensor of claim 14, wherein
the plurality of first transfer transistors are configured to be turned on at the same time in a first mode; and
the plurality of first transfer transistors are each configured to be turned on at different times in a second mode.

17. An image sensor comprising:
a plurality of first pixels arranged in a M×N grid located on a substrate along a first axis and a second axis, the plurality of first pixels including M first shared pixel groups each including N first pixels, each of M first shared pixel groups configured to share a first floating diffusion area, each of the M first shared pixel groups connected with a first output line extending along the second axis, and M being an integer of 2 or more, and N being an integer of 2 or more, and a subset of the plurality of first pixels further being a plurality of first auto focus pixels;
a plurality of first color filters respectively located on a portion of the plurality of first pixels, each of the plurality of first color filters having a first color;

a plurality of first auto focus color filters arranged on the plurality of first auto focus pixels, each of the plurality of first auto focus color filters having a color different than the first color; and a plurality of second pixels arranged in a M×N grid located on the substrate along the first axis and the second axis, the plurality of second pixels including M second shared pixel groups each including N second pixels, each of the M second shared pixel groups configured to share a second floating diffusion area, and each of the M second shared pixel groups connected with the first output line, wherein each of the first shared pixel groups is mirror-symmetric to a corresponding shared pixel group of the second shared pixel groups with respect to the first axis.

18. The image sensor of claim 17, further comprising:
a plurality of second color filters respectively located on the plurality of second pixels, each of the plurality of second color filters having a second color.

19. The image sensor of claim 17, further comprising:
a plurality of third pixels located on the substrate along the first axis and the second axis, the plurality of third pixels including M third shared pixel groups along the first axis; and a plurality of fourth pixels located on the substrate along the first axis and the second axis, the plurality of fourth pixels including M fourth shared pixel groups along the first axis, wherein each of the M third shared pixel groups is mirror-symmetric with a corresponding fourth shared pixel group with respect to the first axis, when one of the M first shared pixel groups moves along the first axis, the moving first shared pixel group overlaps one of the M third shared pixel groups in a plan view, and when one of the M second shared pixel groups moves along the first axis, the moving second shared pixel group overlaps one of the M fourth shared pixel groups in the plan view.

20. The image sensor of claim 19, further comprising:
the plurality of first auto focus color filters are arranged in a I×J grid, and are further arranged on the plurality of first auto focus pixels and the plurality of third pixels, the plurality of first auto focus pixels arranged in the I×J grid, and I and J being integers of 1 or more;

the plurality of first color filters are arranged on the remaining first pixels of the plurality of first pixels, and a total number of plurality of first color filters equaling M×N−I/2×J;

a plurality of third color filters respectively arranged on the remaining third pixels of the plurality of third pixels, the plurality of third color filters each having a same color as the first auto focus color filter, a total number of the plurality of third color filters equaling the total number of the first color filters;

a plurality of fourth color filters respectively arranged on the plurality of second pixels, the plurality of fourth color filters each having the same color as the first auto focus color filters; and a plurality of fifth color filters respectively arranged on the plurality of fourth pixels, the plurality of fifth color filters each having a third color.

* * * * *